(12) United States Patent
Torii

(10) Patent No.: US 11,714,123 B2
(45) Date of Patent: Aug. 1, 2023

(54) PROBE POSITION MONITORING STRUCTURE AND METHOD OF MONITORING POSITION OF PROBE

(71) Applicant: United Semiconductor Japan Co., Ltd., Kuwana (JP)

(72) Inventor: Yasunobu Torii, Kuwana (JP)

(73) Assignee: United Semiconductor Japan Co., Ltd., Kuwana (JP)

(*) Notice: Subject to any disclaimer, the term of this patent is extended or adjusted under 35 U.S.C. 154(b) by 112 days.

(21) Appl. No.: 17/010,819

(22) Filed: Sep. 2, 2020

(65) Prior Publication Data

US 2022/0065925 A1 Mar. 3, 2022

(51) Int. Cl.
*G01R 31/28* (2006.01)
*G01B 7/00* (2006.01)
*G01R 1/073* (2006.01)

(52) U.S. Cl.
CPC ........ *G01R 31/2891* (2013.01); *G01B 7/003* (2013.01); *G01R 1/07307* (2013.01)

(58) Field of Classification Search
None
See application file for complete search history.

(56) References Cited

U.S. PATENT DOCUMENTS

| | | | |
|---|---|---|---|
| 5,654,582 A * | 8/1997 | Kijima | H01L 22/34 257/210 |
| 2005/0258854 A1 | 11/2005 | Kim | |
| 2007/0052085 A1 | 3/2007 | Nagai | |
| 2007/0090851 A1 | 4/2007 | Kim | |
| 2009/0008641 A1 * | 1/2009 | Michimata | G01R 27/205 324/693 |
| 2010/0013506 A1 | 1/2010 | Kim | |
| 2011/0050263 A1 * | 3/2011 | Sato | G01R 1/06722 324/755.05 |
| 2011/0215481 A1 * | 9/2011 | Nagai | H01L 24/12 257/774 |

(Continued)

FOREIGN PATENT DOCUMENTS

| | | |
|---|---|---|
| JP | 58-43535 | 3/1983 |
| JP | 2-137350 | 5/1990 |
| JP | 3-14250 | 1/1991 |

(Continued)

OTHER PUBLICATIONS

Huang; Copper Wire Array Area After Polishing the Surface of Measuring Unit and Measuring Method; CN 103474370 A; Publication date Dec. 25, 2013; (Year: 2013).*

*Primary Examiner* — Nasima Monsur
(74) *Attorney, Agent, or Firm* — Winston Hsu

(57) ABSTRACT

A probe position monitoring structure includes a first common line and a contact portion configured for being directly contacted with a probe. The contact portion includes a first zigzag structure, and a first end of the first zigzag structure is directly connected with the first common line. A method of monitoring a position of a probe includes the following steps. The probe position monitoring structure is provided. The first zigzag structure is directly contacted with a first probe. A resistance measurement is performed to measure a resistance of a portion of the first zigzag structure located between the first probe and the first end for monitoring a position of the first probe.

12 Claims, 16 Drawing Sheets

(56) References Cited

U.S. PATENT DOCUMENTS

2015/0214125 A1* 7/2015 Tang ................. H01L 22/32
                                                                 257/48
2020/0166564 A1* 5/2020 Takano ............. G01R 31/2808

FOREIGN PATENT DOCUMENTS

| JP | 4-162544 | 6/1992 |
| --- | --- | --- |
| JP | 5-343487 | 12/1993 |
| JP | 7-302773 | 11/1995 |
| JP | 8-279539 | 10/1996 |
| JP | 2005-340696 | 12/2005 |
| JP | 2007-48853 | 2/2007 |
| JP | 2007-158346 | 6/2007 |
| JP | 2007-214392 | 8/2007 |
| JP | 2008-71999 | 3/2008 |
| JP | 2008-235485 | 10/2008 |
| JP | 2015-15441 | 1/2015 |

* cited by examiner

PROBE POSITION MONITORING STRUCTURE AND METHOD OF MONITORING POSITION OF PROBE

BACKGROUND OF THE INVENTION

1. Field of the Invention

The present invention relates to a probe position monitoring structure and a method of monitoring a position of a probe, and more particularly, to a probe position monitoring structure including a zigzag structure in a contact portion and a method of monitoring a position of a probe with the probe position monitoring structure.

2. Description of the Prior Art

The manufacture of integrated circuits keeps improving as the related technologies progress. Many kinds of electric circuits may be integrated and formed on a single chip. The semiconductor process for manufacturing chips may include many steps, such as a deposition process for forming a thin film, a photoresist coating process, an exposure process, and a develop process for forming a patterned photoresist, and an etching process for patterning the thin film. The above processes may be repeatedly carried out to form the integrated circuits and/or the corresponding chips on a substrate (such as a wafer). There are many tests required to be performed to test element groups on the substrate and/or to the chips directly during and/or after the manufacturing processes. Generally, test probes are used to make contact with test pad in the tests mentioned above, and the condition of the test element groups and/or the chips may be misjudged by the test results when the test probes do not accurately make contact with the test pads. Therefore, it is important to monitor the positions of the test probes and ensure the test probes accurately make contact with the corresponding test pads before using the test results to determine the condition of the tested objects.

SUMMARY OF THE INVENTION

A probe position monitoring structure and a method of monitoring a position of a probe are provided in the present invention. A contact portion of the probe position monitoring structure includes a zigzag structure for being used in a resistance measurement where a probe directly contacts the zigzag structure, and the position of the probe may be monitored by measuring a resistance of the zigzag structure between a common line and the probe.

According to an embodiment of the present invention, a probe position monitoring structure is provided. The probe position monitoring structure includes a first common line and a contact portion configured for being directly contacted with a probe. The contact portion includes a first zigzag structure, and a first end of the first zigzag structure is directly connected with the first common line.

According to an embodiment of the present invention, a method of monitoring a position of a probe is provided. The method includes the following steps. A probe position monitoring structure is provided. The probe position monitoring structure includes a first common line and a contact portion. The contact portion includes a first zigzag structure, and a first end of the first zigzag structure is directly connected with the first common line. The first zigzag structure is directly contacted with a first probe. A resistance measurement is performed to measure a resistance of a portion of the first zigzag structure located between the first probe and the first end for monitoring a position of the first probe.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 6A-6C are schematic drawings illustrating a method of monitoring a position of a probe with the probe position monitoring structure of the first embodiment according to another embodiment of the present invention, wherein FIG. 6A is a schematic drawing illustrating a two-point measurement step via a first probe and a second probe, FIG. 6B is a schematic drawing illustrating a two-point measurement step via the second probe and a third probe, and FIG. 6C is a schematic drawing illustrating a two-point measurement step via the first probe and the third probe.

FIGS. 7A-7C are schematic drawings illustrating a method of monitoring a position of a probe with the probe position monitoring structure of the first embodiment according to another embodiment of the present invention, wherein FIG. 7A is a schematic drawing illustrating a three-point measurement step via a first probe, a second probe, and a third probe, FIG. 7B is a schematic drawing illustrating another three-point measurement step via the first probe, the second probe, and the third probe, and FIG. 7C is a schematic drawing illustrating further another three-point measurement step via the first probe, the second probe, and the third probe.

FIGS. 8A-8C are schematic drawings illustrating a method of monitoring a position of a probe with the probe position monitoring structure of the first embodiment according to another embodiment of the present invention, wherein FIG. 8A is a schematic drawing illustrating a three-point measurement step via a first probe, a second probe, and a third probe, FIG. 8B is a schematic drawing illustrating another three-point measurement step via the first probe, the second probe, and the third probe, and FIG. 8C is a schematic drawing illustrating further another three-point measurement step via the first probe, the second probe, and the third probe.

FIG. 10A and FIG. 10B are schematic drawings illustrating a method of monitoring a position of a probe with the probe position monitoring structure of the second embodiment according to an embodiment of the present invention, wherein FIG. 10A is a schematic drawing illustrating a two-point measurement step via a first probe and a second probe, and FIG. 10B is a schematic drawing illustrating a two-point measurement step via the second probe and a third probe.

FIGS. 14A-14C are schematic drawings illustrating a method of monitoring a position of a probe with the probe position monitoring structure of the fourth embodiment, wherein FIG. 14A is a schematic drawing illustrating a four-point measurement step via a first probe, a second probe, a third probe, and a fourth probe, FIG. 14B is a schematic drawing illustrating another four-point measurement step via the first probe, the second probe, a fifth probe, and a sixth probe, and FIG. 14C is a schematic drawing illustrating further another four-point measurement step via the first probe, the third probe, the fourth probe, and the fifth probe.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

It should be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Figure 1:
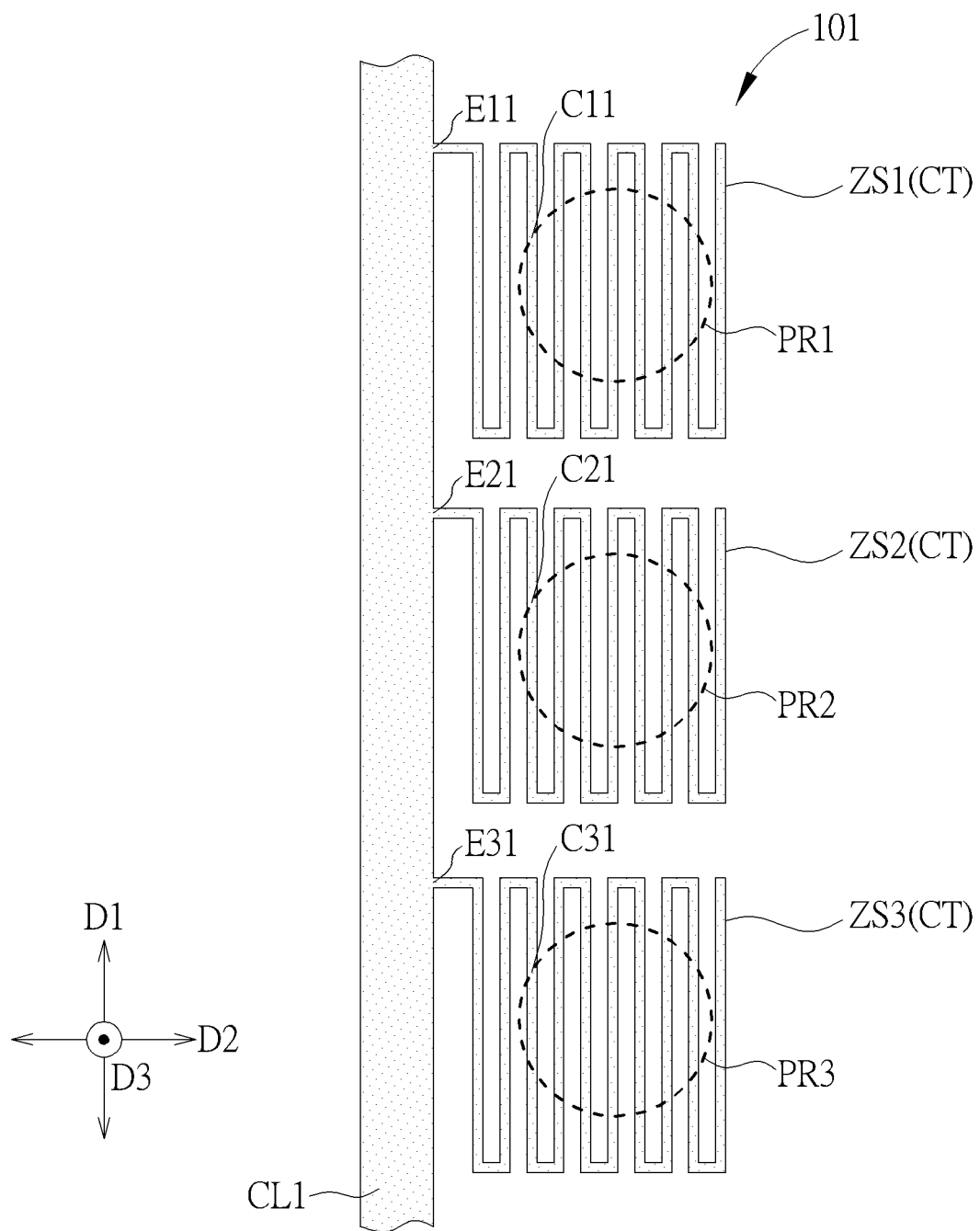
FIG. 1 is a schematic drawing illustrating a probe position monitoring structure according to a first embodiment of the present invention.
Figure 2:
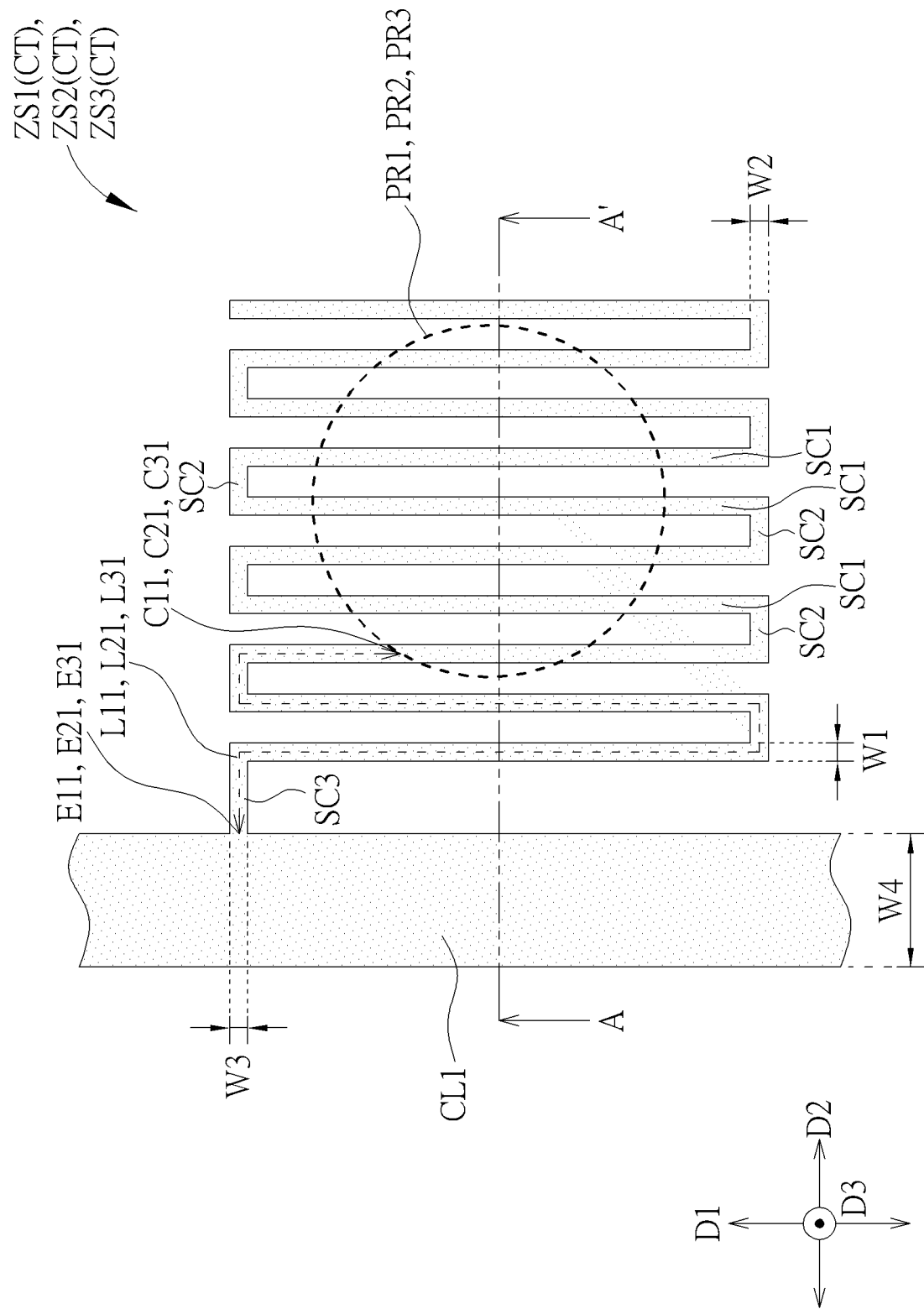
FIG. 2 is a schematic drawing illustrating an enlargement of a part of the probe position monitoring structure according to the first embodiment of the present invention.

FIG. 1 is a schematic drawing illustrating a probe position monitoring structure according to a first embodiment of the present invention, and FIG. 2 is a schematic drawing illustrating an enlargement of a part of the probe position monitoring structure. As illustrated in FIG. 1 and FIG. 2, a probe position monitoring structure 101 is provided in this embodiment. The probe position monitoring structure 101 includes a first common line CL1 and a contact portion CT configured for being directly contacted with a probe (such as a first probe PR1, a second probe PR2, and/or a third probe PR3 represented in FIG. 1 and FIG. 2). The contact portion CT includes a first zigzag structure ZS1, and a first end E11 of the first zigzag structure ZS1 is directly connected with the first common line CL1. In some embodiments, the first zigzag structure ZS1 may extend in horizontal directions (such as a first direction D1 and a second direction D2 represented in FIG. 1 and FIG. 2) for being directly contacted with the probe in a vertical direction (such as a third direction D3 represented in FIG. 1 and FIG. 2), but not limited thereto. For example, the first zigzag structure ZS1 may include a plurality of first sections SC1 and a plurality of second sections SC2. Each of the first sections SC1 may be elongated in the first direction D1, and the first sections SC1 may be repeatedly arranged in the second direction D2 and disposed parallel to one another. Each of the second sections SC2 may be elongated in the second direction D2 and directly connected with two of the first sections SC1 located adjacent to each other in the second direction D2. In other words, there are S-shaped structures composed of the first sections SC1 and the second sections SC2 in the first zigzag structure ZS1. The second direction D2 is different from the first direction D1. In some embodiments, the first direction D1 and the second direction D2 may be orthogonal and perpendicular to each other, but not limited thereto.

In addition, the first zigzag structure ZS1 may be directly connected with the first common line CL1 via a third section SC3 of the first zigzag structure ZS1, and the third section SC3 may be elongated in the second direction D2. One end of the third section SC3 (such as the first end E11) may be directly connected with the first common line CL1 and another end of the third section SC3 in the second direction D2 may be directly connected with one of the first sections SC1 adjacent to the first common line CL1. In some embodiments, the line widths of the sections of the first zigzag structure ZS1 may be equal to one another preferably for calculating the length of the first zigzag structure ZS1 located between the first probe PR1 and the first end E11 of the first zigzag structure ZS1 (such as a length L11 represented in FIG. 2) so as to monitor the position of the first probe PR1. In other words, a width W1 of each of the first sections SC1, a width W2 of each of the second sections SC2, and a width W3 of the third section SC3 may be substantially equal to one another, but not limited thereto. In some embodiments, the width W1 of each of the first sections SC1 may be less than a width W4 of the first common line CL1 for neglecting the resistance of the first common line CL1 in the calculation of the length of the first zigzag structure ZS1 located between the first probe PR1 and the first end E11 of the first zigzag structure ZS1 described above. For example, a ratio of the width W4 of the first common line CL1 to the width W1 of each of the first sections SC1 (W4/W1) may range from 5 to 200, but not limited thereto.

In some embodiments, the contact portion CT in the probe position monitoring structure 101 may further include a second zigzag structure ZS2 and a third zigzag structure ZS3. The first zigzag structure ZS1, the second zigzag structure ZS2, and the third zigzag structure ZS3 may be aligned in the first direction D1, and a pattern of the first zigzag structure ZS1, a pattern of the second zigzag structure ZS2, and a pattern of the third zigzag structure ZS3 in the third direction D3 may be identical to one another for monitoring the positions of the first probe PR1 contacting the first zigzag structure ZS1, the second probe PR2 contacting the second zigzag structure ZS2, and the third probe PR3 contacting the third zigzag structure ZS3, but not limited thereto. In some embodiments a first end E21 of the second zigzag structure ZS2 and a first end E31 of the third zigzag structure ZS3 may be directly connected with the first common line CL1 respectively, and the first zigzag structure ZS1, the second zigzag structure ZS2, the third zigzag structure ZS3, and the first common line CL1 may be different parts of one conductive layer (such as a metal layer embedded in a dielectric material), but not limited thereto.

Figure 3:
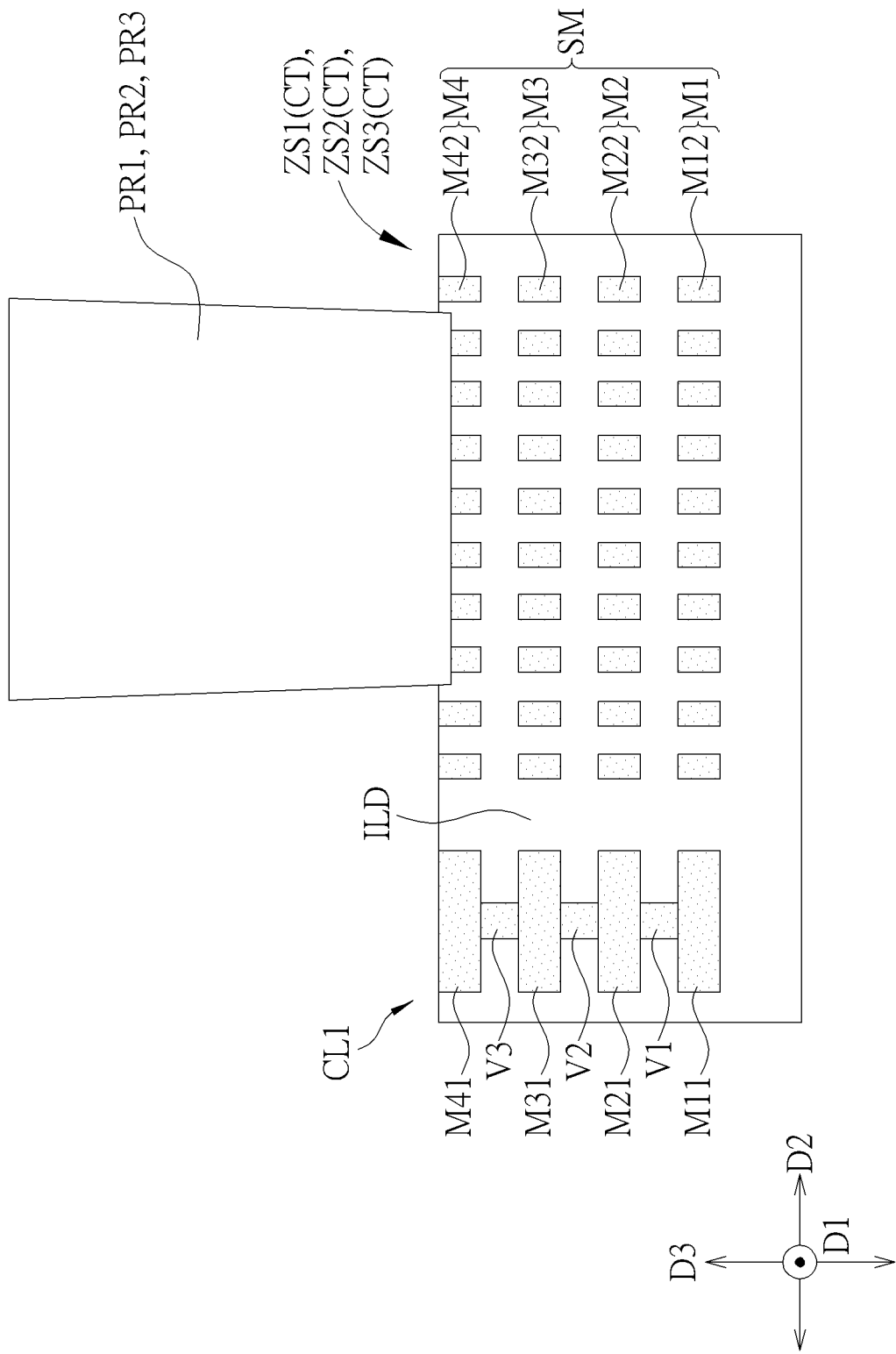
FIG. 3 is a cross-sectional diagram taken along a line A-A' in FIG. 2.

FIG. 3 is a cross-sectional diagram taken along a line A-A' in FIG. 2. As illustrated in FIGS. 1-3, the probe position monitoring structure 101 may further include an interlayer dielectric ILD, and the first common line CL1 and the contact portion CT may be at least partially disposed in the interlayer dielectric ILD. In some embodiments, a plurality of conductive layers (such as a metal layer M1, a metal layer M2, a metal layer M3, and a metal layer M4 represented in FIG. 3) may be disposed in the interlayer dielectric ILD and disposed stacked with one another in the third direction D3 for forming a stacked structure (such as a stacked metal layer SM represented in FIG. 3). The third direction D3 may be regarded as a vertical direction and a thickness direction of the interlayer dielectric ILD, and the first direction D1 and the second direction D2 may be regarded as horizontal directions orthogonal to the third direction D3, but not limited thereto. In some embodiments, one or more of the metal layers in the stacked metal layer SM may be used to form the first common line CL1 and the contact portion CT described above. For example, the first common line CL1 may include a first layer (such as a first portion M11 of the metal layer M1), a second layer (such as a first portion M21 of the metal layer M2), a third layer (such as a first portion M31 of the metal layer M3), and a fourth layer (such as a first portion M41 of the metal layer M4) stacked in the third direction D3, and the first zigzag structure ZS1 may include a first layer (such as a second portion M12 of the metal layer M1), a second layer (such as a second portion M22 of the metal layer M2), a third layer (such as a second portion M32 of the metal layer M3), and a fourth layer (such as a second portion M42 of the metal layer M4) stacked in the third direction D3 and separated from one another by a portion of the interlayer dielectric ILD, but not limited thereto. In some embodiments, the first common line CL1 may be composed of the first portion M41 of the metal layer M4 only, the contact portion CT may be composed of the second portion M42 of the metal layer M4, and the first common line CL1 and the contact portion CT may be at least located in a top layer of the stacked metal layer SM accordingly, but not limited thereto. In some embodiment, the first zigzag structure ZS1, the second zigzag structure ZS2, the third zigzag structure ZS3, and the first common line CL1 may be different parts of one conductive layer (such as the metal layer M4), but not limited thereto.

In some embodiments, connection plugs (such as a connection plug V1, a connection plug V2, and a connection plug V3 represented in FIG. 3) may be disposed between the metal layers of the first common line CL1 for electrically connecting the first portion M11 of the metal layer M1, the first portion M21 of the metal layer M2, the first portion M31 of the metal layer M3, and the first portion M41 of the metal layer M4, but not limited thereto. In some embodiments, the metal layer M1, the metal layer M2, the metal layer M3, and the metal layer M4 may be electrically insulated from one another, and the metal layer M1, the metal layer M2, the metal layer M3, and the metal layer M4 may be regarded as being electrically floating, but not limited thereto. In some embodiments, the pattern of the zigzag structure represented in FIG. 2 may be regarded as the pattern of the second portion M42 of the metal layer M4 in the third direction D3. The pattern of the second portion M32 of the metal layer M3 in the third direction, the pattern of the second portion M22 of the metal layer M2 in the third direction D3, and the pattern of the second portion M12 of the metal layer M1 in the third direction D3 may be identical to the pattern of the second portion M42 of the metal layer M4 in the third direction D3 respectively. In some embodiments, the stacked metal layer SM and an interconnection structure (not represented) may be formed concurrently by the same back end of line (BEOL) process in a semiconductor manufacturing method. Therefore, when the metal layer M4 is the last metal in the BEOL process, the second portion M42 of the metal layer M4 may be directly contacted with a probe in a final test measurement step, the second portion M32 of the metal layer M3 may be directly contacted with a probe in an in-line test measurement step before the step of forming the metal layer M4, the second portion M22 of the metal layer M2 may be directly contacted with a probe in an in-line test measurement step before the step of forming the metal layer M3, and the second portion M12 of the metal layer M1 may be directly contacted with a probe in an in-line test measurement step before the step of forming the metal layer M2. In some embodiments, the second portion M42 of the metal layer M4, the second portion M32 of the metal layer M3, the second portion M22 of the metal layer M2, and the second portion M12 of the metal layer M1 may be separated from one another by a portion of the interlayer dielectric ILD for avoiding the influence of conductive residues generated by the previous test measurement step on the measurement result of the current test measurement step.

In some embodiments, the interlayer dielectric ILD may be formed on a semiconductor substrate (such as a semiconductor wafer, not represented in FIGS. 1-3) in the BEOL process described above, and the interlayer dielectric ILD may include a single layer structure or a multiple layer structure of dielectric materials, such as silicon oxide, low dielectric constant (low-k) dielectric materials, or other suitable dielectric materials. The low-k dielectric material described above may include benzocyclobutene (BCB), hydrogen silsesquioxane (HSQ), methyl silsesquioxane (MSQ), hydrogenated silicon oxycarbide (SiOC—H), porous dielectric materials, or other suitable materials having relatively lower dielectric constant. In some embodiments, the metal layers M1-M4 and the connection plugs V1-V3 may respectively include a barrier material and a conductive material disposed on the barrier material. The barrier material may include titanium (Ti), titanium nitride (TiN), tantalum (Ta), tantalum nitride (TaN), or other suitable conductive barrier materials, and the conductive material may include tungsten (W), copper (Cu), aluminum (Al), titanium aluminide (TiAl), cobalt tungsten phosphide (CoWP), or other suitable metallic conductive materials. In some embodiments, the probes (such as the first probe PR1, the second probe PR2, and the third probe PR3) may be probe needles connected with a probe card structure (not represented), and the material of the probes may include tungsten, tungsten-rhenium (WRe), beryllium copper (BeCu), or other suitable conductive materials.

Figure 4:
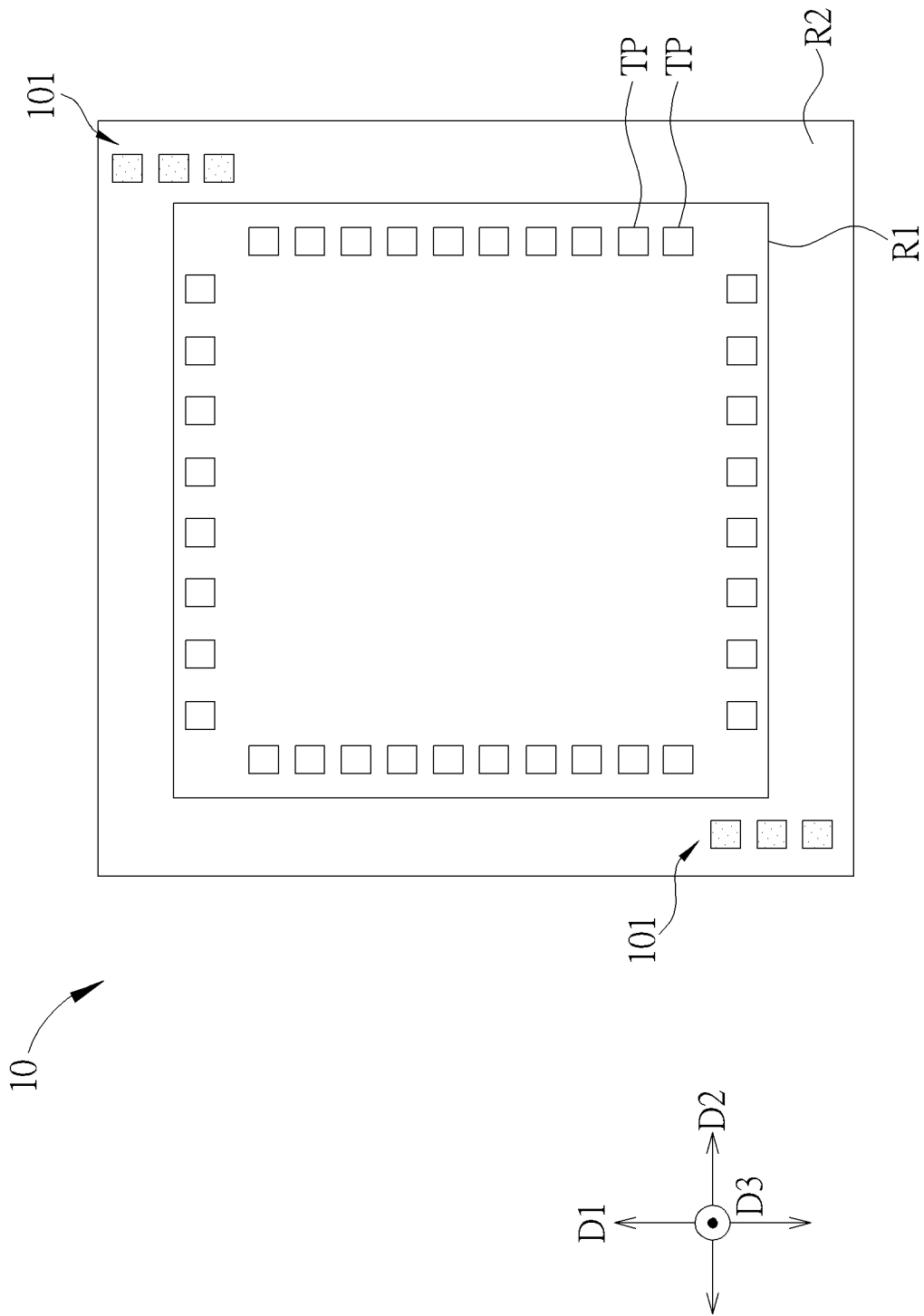
FIG. 4 is a schematic drawing illustrating a semiconductor wafer including the probe position monitoring structure according to an embodiment of the present invention.

FIG. 4 is a schematic drawing illustrating a semiconductor wafer 10 including the probe position monitoring structure 101 according to an embodiment of the present invention. As illustrated in FIG. 1 and FIG. 4, a first region R1 and a second region R2 adjacent to the first region R1 may be defined on the semiconductor wafer 10. A semiconductor chip (not represented) and a plurality of contact pads TP may be disposed within the first region R1, and the probe position monitoring structure 101 may be disposed within the second region R2. In some embodiments, the second region R2 may be a scribe region between the semiconductor chips in a wafer dicing process, and marks (such as alignment marks) for the production of the semiconductor wafer 10, inline test pads, test pads for a final check may be disposed within the second region R2, but not limited thereto. In some embodiments, the probes (such as the first probe PR1, the second probe PR2, and the third probe PR3) configured to contact the zigzag structures of the contact portion CT in the probe position monitoring structure 101 and other probe needles configured to contact the inline test pads, the test pads for the final check, and/or the contact pads TP may be connected to the same probe card structure, and the positions of the probe needles may be monitored relatively by monitoring the position of the first probe PR1, the second probe PR2, and/or the third probe PR3 accordingly.

Figure 5:
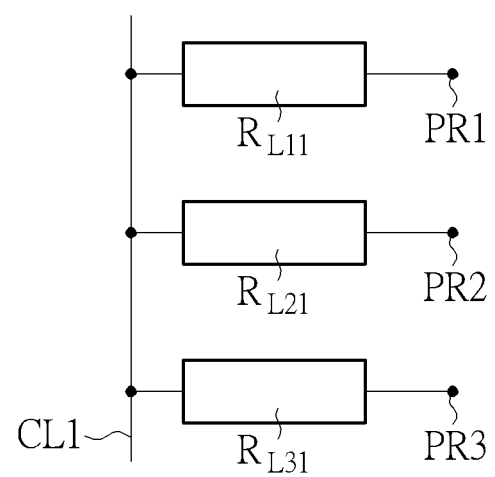
FIG. 5 is a schematic drawing illustrating a method of monitoring a position of a probe with the probe position monitoring structure of the first embodiment according to an embodiment of the present invention.

FIG. 5 is a schematic drawing illustrating a method of monitoring a position of a probe with the probe position monitoring structure 101 according to an embodiment of the present invention. As illustrated in FIG. 1, FIG. 2, and FIG. 5, a method of monitoring a position of a probe may include the following steps. The probe position monitoring structure 101 is provided. The probe position monitoring structure 101 includes the first common line CL1 and the contact portion CT configured for being directly contacted with a probe. The contact portion CT includes the first zigzag structure ZS1, and the first end E11 of the first zigzag structure ZS1 is directly connected with the first common line CL1. The first zigzag structure ZS1 is directly contacted with the first probe PR1. A resistance measurement is performed to measure a resistance of a portion of the first zigzag structure ZS1 located between the first probe PR1 and the first end E11 for monitoring the position of the first probe PR1.

In some embodiments, the method of monitoring the position of the probe may include but is not limited to the following steps. As illustrated in FIGS. 1-3 and FIG. 5, in some embodiments, the first zigzag structure ZS1 is directly contacted with the first probe PR1, the second zigzag structure ZS2 is directly contacted with the second probe PR2, and the third zigzag structure ZS3 is directly contacted with the third probe PR3, and a resistance of a portion of the first zigzag structure ZS1 located between the first probe PR1 and the first end E11 of the first zigzag structure ZS1 (such as a resistance $R_{L11}$ represented in FIG. 5), a resistance of a portion of the second zigzag structure ZS2 located between the second probe PR2 and the first end E21 of the second zigzag structure ZS2 (such as a resistance $R_{L21}$ represented in FIG. 5), and a resistance of a portion of the third zigzag structure ZS3 located between the third probe PR3 and the first end E31 of the third zigzag structure ZS3 (such as a resistance $R_{L31}$ represented in FIG. 5) may be obtained by the resistance measurement via the first probe PR1, the second probe PR2, and the third probe PR3. In other words, the resistance measurement may be performed to measure the resistance $R_{L11}$, the resistance $R_{L21}$, and the resistance $R_{L31}$. In addition, the method of monitoring the position of the probe may further include calculating the length L11 of the portion of the first zigzag structure ZS1 located between the first probe PR1 and the first end E11 of the first zigzag structure ZS1 according to a result of the resistance measurement described above. For example, the resistance $R_{L11}$ may be the electrical resistance of the first zigzag structure ZS1 located between the first end E11 and a contact end C11 directly contacting the first probe PR1, and the length L11 of the first zigzag structure ZS1 located between the first end E11 and the contact end C11 may be calculated by the following equation, wherein ρ stands for the electrical resistivity of the first zigzag structure ZS1 (such as an electrical resistivity of the metal layer M4, but not limited thereto), and H stands for the thickness of the first zigzag structure ZS1 (such as a thickness of the metal layer M4 in the third direction D3, but not limited thereto).

$$R_{L11} = \rho \times \frac{L11}{W1 \times H}$$

Similarly, the resistance $R_{L21}$ may be the electrical resistance of the second zigzag structure ZS2 located between the first end E21 and a contact end C21 directly contacting the second probe PR2, the resistance $R_{L31}$ may be the electrical resistance of the third zigzag structure ZS3 located between the first end E31 and a contact end C31 directly contacting the third probe PR3, and the length L21 of the second zigzag structure ZS2 located between the first end E21 and the contact end C21 and the length L31 of the third zigzag structure ZS3 located between the first end E31 and the contact end C31 may be calculated according to the result of the resistance measurement described above. Accordingly, the positions of the first probe PR1, the second probe PR2, and the third probe PR3 may be monitored by the length L11, the length L21, and the length L31 obtained via the resistance measurement described above. In some embodiments, the length L11 may be regarded as the length of the shortest path along the first zigzag structure ZS1 between the first end E11 and the first probe PR1, the length L21 may be regarded as the length of the shortest path along the second zigzag structure ZS2 between the first end E21 and the second probe PR2, and the length L31 may be regarded as the length of the shortest path along the third zigzag structure ZS3 between the first end E31 and the third probe PR3, but not limited thereto.

Figure 6A:
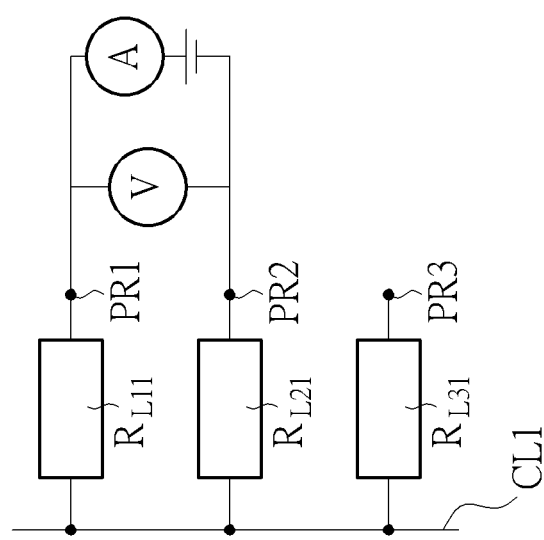
Figure 6B:
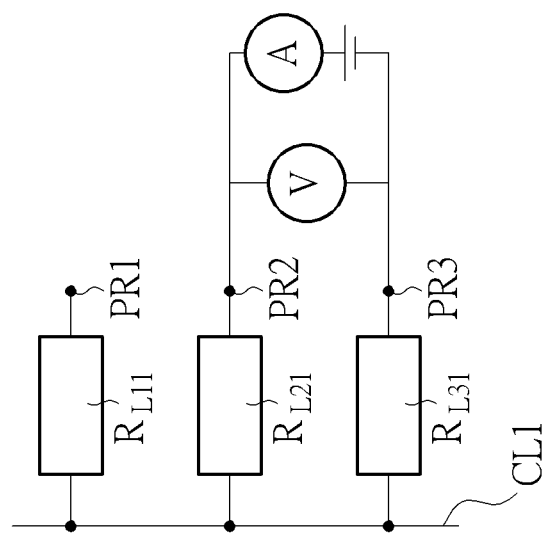
Figure 6C:
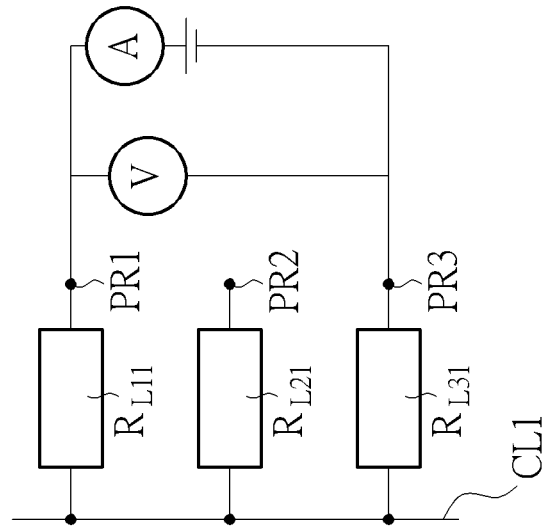

FIGS. 6A-6C are schematic drawings illustrating a method of monitoring a position of a probe with the probe position monitoring structure 101 according to an embodiment of the present invention. As illustrated in FIGS. 1-3 and FIGS. 6A-6C, in some embodiments, the resistance measurement may include two-point measurement steps via the first probe PR1, the second probe PR2, and the third probe PR3. For example, as illustrated in FIG. 6A, the DC power supply may be connected to the first probe PR1 and the second probe PR2 for supply a constant current (the value may be obtained from the ammeter connected with the DC power supply), and the voltmeter may be connected to the first probe PR1 and the second probe PR2 also for measuring the voltage drop between the first probe PR1 and the second probe PR2 and obtaining a first resistance value $R_{6A}$ in a first two-point measurement step. Similarly, as illustrated in FIG. 6B, the DC power supply may be connected to the second probe PR2 and the third probe PR3 for supply a constant current, and the voltmeter may be connected to the second probe PR2 and the third probe PR3 also for measuring the voltage drop between the second probe PR2 and the third probe PR3 and obtaining a second resistance value $R_{6B}$ in a second two-point measurement step. As illustrated in FIG. 6C, the DC power supply may be connected to the first probe PR1 and the third probe PR3 for supply a constant current, and the voltmeter may be connected to the first probe PR1 and the third probe PR3 also for measuring the voltage drop between the first probe PR1 and the third probe PR3 and obtaining a third resistance value $R_{6C}$ in a third two-point measurement step. The resistance value obtained in each of the measurement steps may be equal to the voltage value from the voltmeter divided by the current value from the ammeter in each of the measurement steps described above. In some embodiments, the first resistance value $R_{6A}$ may be substantially equal to the sum of the resistance $R_{L11}$ and the resistance $R_{L21}$, the second resistance value $R_{6B}$ may be substantially equal to the sum of the resistance $R_{L21}$ and the resistance $R_{L31}$, and the third resistance value $R_{6C}$ may be substantially equal to the sum of the resistance $R_{L11}$ and the resistance $R_{L31}$ especially when the resistance of the first common line CL1 is relatively much lower than the resistance $R_{L11}$, the resistance $R_{L21}$, and the resistance $R_{L31}$ and can be omitted accordingly. Therefore, the resistance $R_{L11}$, the resistance $R_{L21}$, and the resistance $R_{L31}$ may be respectively calculated according to the results of the two-point measurement steps described above.

Figure 7C:
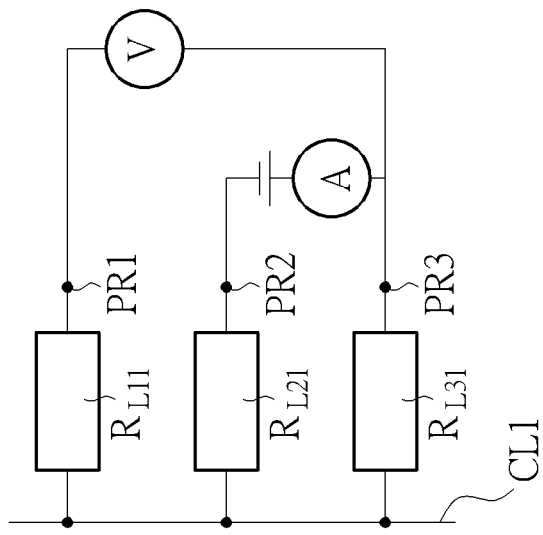
Figure 7B:
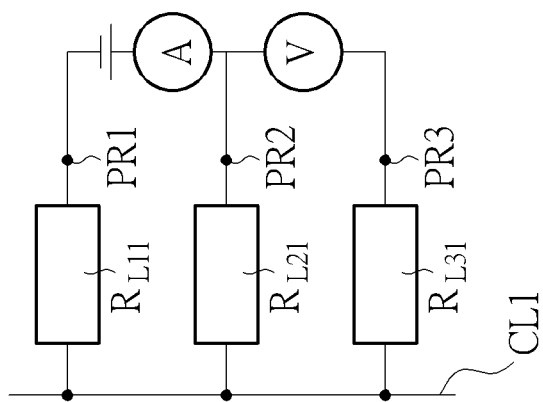
Figure 7A:
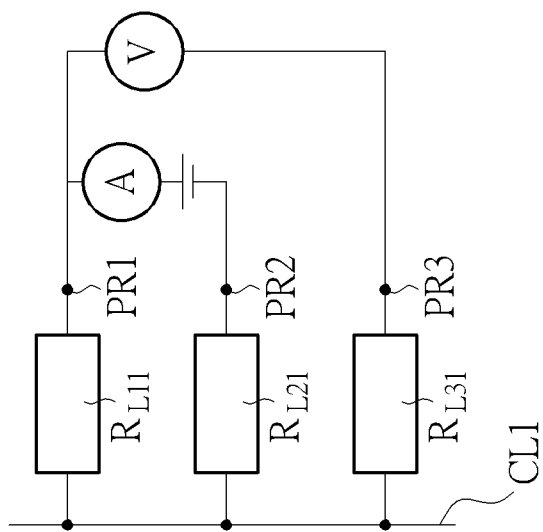

FIGS. 7A-7C are schematic drawings illustrating a method of monitoring a position of a probe with the probe position monitoring structure 101 according to an embodiment of the present invention. As illustrated in FIGS. 1-3 and FIGS. 7A-7C, in some embodiments, the resistance measurement may include three-point measurement steps via the first probe PR1, the second probe PR2, and the third probe PR3. For example, as illustrated in FIG. 7A, the DC power supply may be connected to the first probe PR1 and the second probe PR2 for supply a constant current, and the voltmeter may be connected to the first probe PR1 and the third probe PR3 for measuring the voltage drop between the first probe PR1 and the third probe PR3 and obtaining a first resistance value $R_{7A}$ in a first three-point measurement step. As illustrated in FIG. 7B, the DC power supply may be connected to the first probe PR1 and the second probe PR2 for supply a constant current, and the voltmeter may be connected to the second probe PR2 and the third probe PR3 for measuring the voltage drop between the second probe PR2 and the third probe PR3 and obtaining a second resistance value $R_{7B}$ in a second three-point measurement step. As illustrated in FIG. 7C, the DC power supply may be connected to the second probe PR2 and the third probe PR3 for supply a constant current, and the voltmeter may be connected to the first probe PR1 and the third probe PR3 for measuring the voltage drop between the first probe PR1 and the third probe PR3 and obtaining a third resistance value $R_{7C}$ in a third three-point measurement step. In some embodiments, the first resistance value $R_{7A}$ may be substantially equal to the resistance $R_{L11}$, the second resistance value $R_{7B}$ may be substantially equal to the resistance $R_{L21}$, and the third resistance value $R_{7C}$ may be substantially equal to the resistance $R_{L31}$ especially when the resistance of the first common line CL1 is relatively much lower than the resistance $R_{L11}$, the resistance $R_{L21}$, and the resistance $R_{L31}$ and can be omitted accordingly.

Figure 8C:
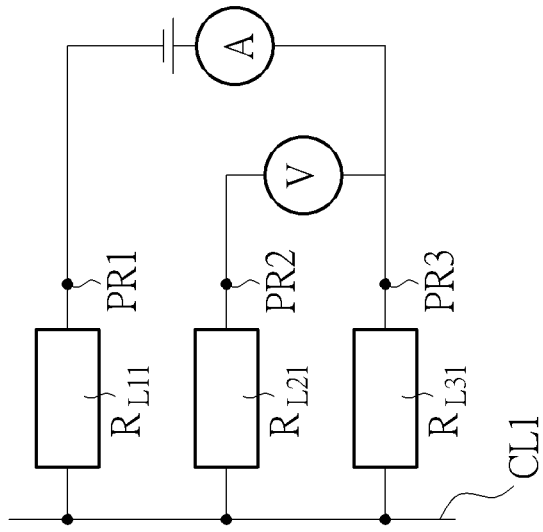
Figure 8B:
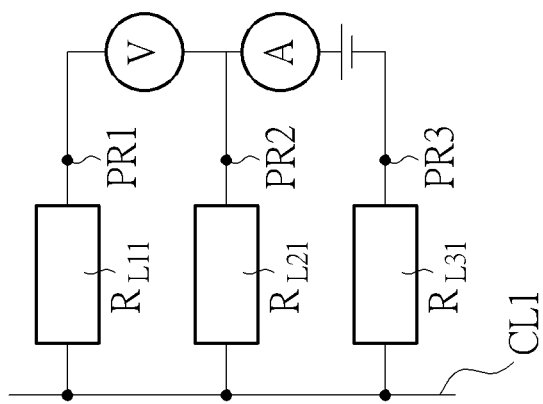
Figure 8A:
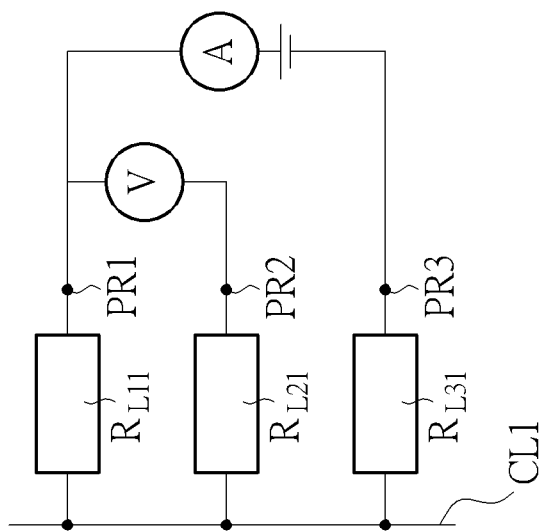

FIGS. 8A-8C are schematic drawings illustrating a method of monitoring a position of a probe with the probe position monitoring structure 101 according to an embodiment of the present invention. As illustrated in FIGS. 1-3 and FIGS. 8A-8C, in some embodiments, the resistance measurement may include three-point measurement steps via the first probe PR1, the second probe PR2, and the third probe PR3. For example, as illustrated in FIG. 8A, the DC power supply may be connected to the first probe PR1 and the third probe PR3 for supply a constant current, and the voltmeter may be connected to the first probe PR1 and the second probe PR2 for measuring the voltage drop between the first probe PR1 and the second probe PR2 and obtaining a first resistance value $R_{8A}$ in a first three-point measurement step. As illustrated in FIG. 8B, the DC power supply may be connected to the second probe PR2 and the third probe PR3 for supply a constant current, and the voltmeter may be connected to the first probe PR1 and the second probe PR2 for measuring the voltage drop between the first probe PR1 and the second probe PR2 and obtaining a second resistance value $R_{8B}$ in a second three-point measurement step. As illustrated in FIG. 8C, the DC power supply may be connected to the first probe PR1 and the third probe PR3 for supply a constant current, and the voltmeter may be connected to the second probe PR2 and the third probe PR3 for measuring the voltage drop between the second probe PR2 and the third probe PR3 and obtaining a third resistance value $R_{8C}$ in a third three-point measurement step. In some embodiments, the first resistance value $R_{8A}$ may be substantially equal to the resistance $R_{L11}$, the second resistance value $R_{8B}$ may be substantially equal to the resistance $R_{L21}$, and the third resistance value $R_{8C}$ may be substantially equal to the resistance $R_{L31}$ especially when the resistance of the first common line CL1 is relatively much lower than the resistance $R_{L11}$, the resistance $R_{L21}$, and the resistance $R_{L31}$ and can be omitted accordingly.

It is worth noting that the measuring approach of the resistance measurement in the method of monitoring the position of the probe with the probe position monitoring structure 101 is not limited to the measurement steps described above and other suitable measuring approaches may also be applied to measuring the resistance $R_{L11}$, the resistance $R_{L21}$, and the resistance $R_{L31}$.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
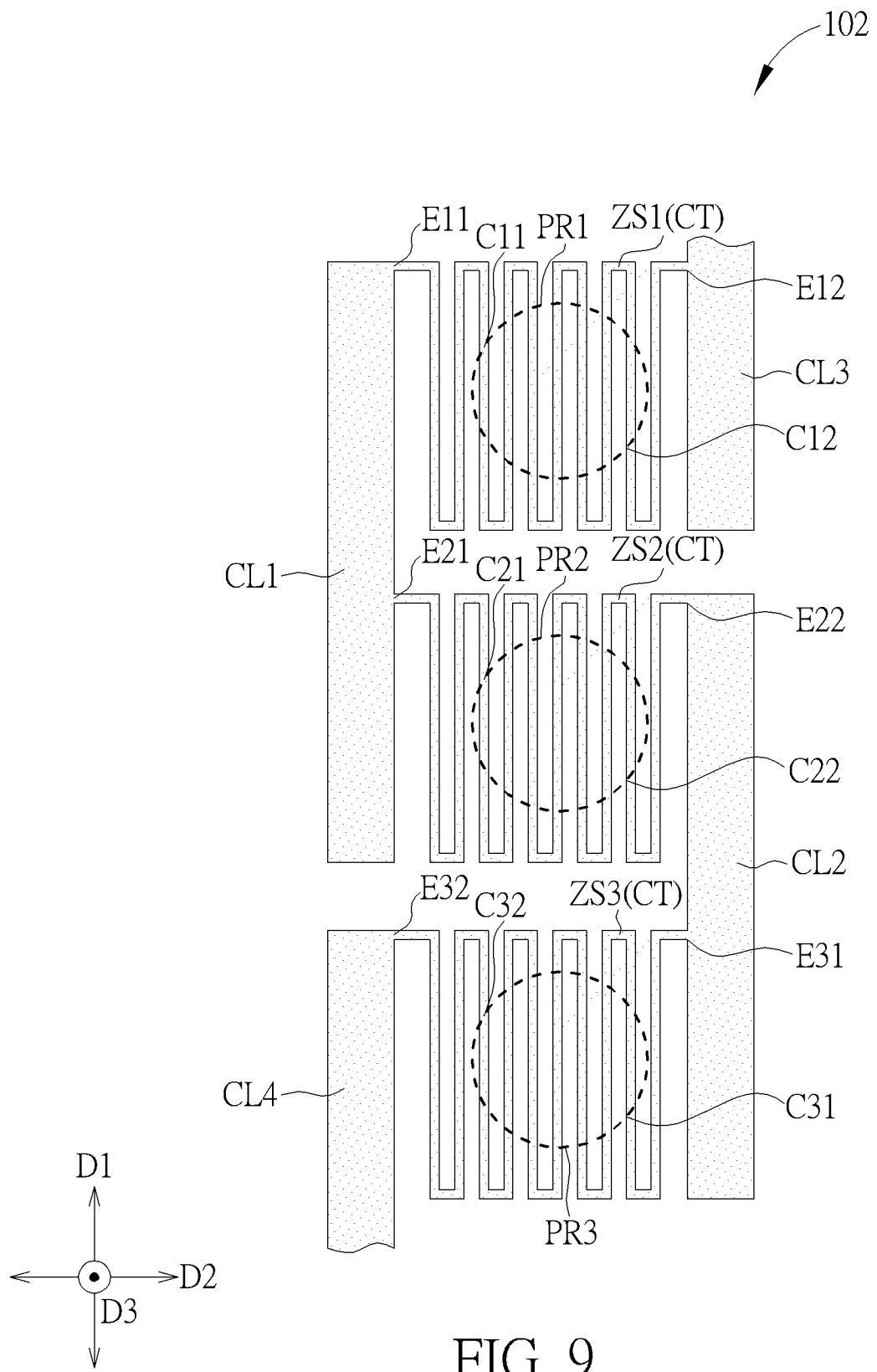
FIG. 9 is a schematic drawing illustrating a probe position monitoring structure according to a second embodiment of the present invention.

FIG. 9 is a schematic drawing illustrating a probe position monitoring structure 102 according to a second embodiment of the present invention. As illustrated in FIG. 9, the probe position monitoring structure 102 may further include a second common line CL2. The first end E21 of the second zigzag structure ZS2 may be directly connected with the first common line CL1, a second end E22 of the second zigzag structure ZS2 may be directly connected with the second common line CL2, and the first end E31 of the third zigzag structure ZS3 may be directly connected with the second common line CL2. In some embodiments, the probe position monitoring structure 102 may further include a third common line CL3 and a fourth common line CL4, a second end E12 of the first zigzag structure ZS1 may be directly connected with the third common line CL3, and a second end E32 of the third zigzag structure ZS3 may be directly connected with the fourth common line CL4. The material compositions and the structures of the second common line CL2, the third common line CL3, and the fourth common line CL4 may be similar to those of the first common line CL1. The first end E11 and the second end E12 may be two opposite ends of the first zigzag structure ZS1 in the second direction D2, the first end E21 and the second end E22 may be two opposite ends of the second zigzag structure ZS2 in the second direction D2, and the first end E31 and the second end E32 may be two opposite ends of the third zigzag structure ZS2 in the second direction D2.

Figure 10A:
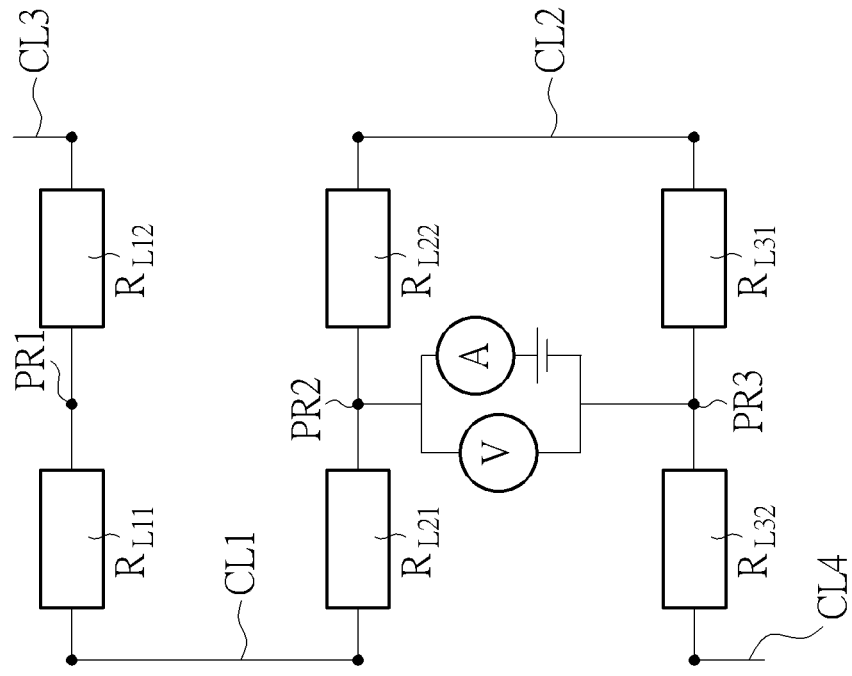
Figure 10B:
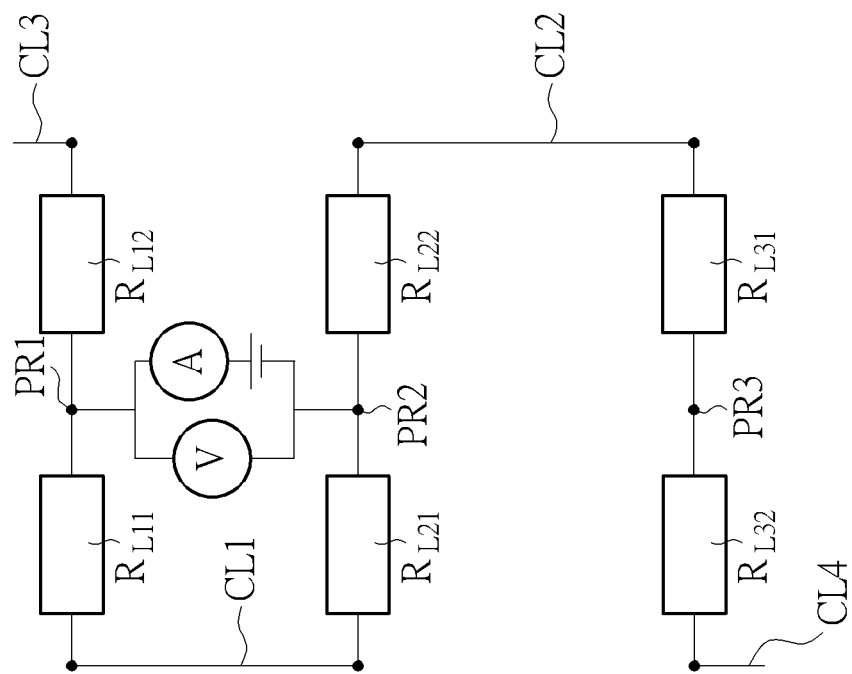

FIG. 10A and FIG. 10B are schematic drawings illustrating a method of monitoring a position of a probe with the probe position monitoring structure 102 according to an embodiment of the present invention. As illustrated in FIG. 9, FIG. 10A, and FIG. 10B, the method of monitoring the position of the probe with the probe position monitoring structure 102 may include directly contacting the first zigzag structure ZS1 with the first probe PR1, directly contacting the second zigzag structure ZS2 with the second probe PR2, and directly contacting the third zigzag structure ZS3 with the third probe PR3. The resistance measurement in this embodiment may be performed to measure the resistance of the portion of the first zigzag structure ZS1 located between the first probe PR1 and the first end E11 of the first zigzag structure ZS1 (such as the resistance $R_{L11}$ represented in FIG. 10A), the resistance of the portion of the second zigzag structure ZS2 located between the second probe PR2 and the first end E21 of the second zigzag structure ZS2 (such as the resistance $R_{L21}$ represented in FIG. 10A), a resistance of a portion of the second zigzag structure ZS2 located between the second probe PR2 and the second end E22 of the second zigzag structure ZS2 (such as a resistance $R_{L22}$ represented in FIG. 10A), and the resistance of a portion of the third zigzag structure ZS3 located between the third probe PR3 and the first end E31 of the third zigzag structure ZS3 (such as the resistance $R_{L31}$ represented in FIG. 10A). The resistance $R_{L11}$ may be the electrical resistance of the first zigzag structure ZS1 located between the first end E11 and the contact end C11, a resistance $R_{L12}$ may be the electrical resistance of the first zigzag structure ZS1 located between the second end E12 and a contact end C12 directly contacting the first probe PR1, the resistance $R_{L21}$ may be the electrical resistance of the second zigzag structure ZS2 located between the first end E21 and the contact end C21, the resistance $R_{L22}$ may be the electrical resistance of the second zigzag structure ZS2 located between the second end E22 and a contact end C22 directly contacting the second probe PR2, the resistance $R_{L31}$ may be the electrical resistance of the third zigzag structure ZS3 located between the first end E31 and the contact end C31, and a resistance $R_{L32}$ may be the electrical resistance of the third zigzag structure ZS3 located between the second end E32 and a contact end C32 directly contacting the third probe PR3.

In some embodiments, the resistance measurement may include a two-point measurement step via the first probe PR1 and the second probe PR2 and another two-point measurement step via the second probe PR2 and the third probe PR3. For example, as illustrated in FIG. 10A, the DC power supply may be connected to the first probe PR1 and the second probe PR2 for supply a constant current, and the voltmeter may be connected to the first probe PR1 and the second probe PR2 also for measuring the voltage drop between the first probe PR1 and the second probe PR2 and obtaining a first resistance value $R_{10A}$ in a first two-point measurement step. As illustrated in FIG. 10B, the DC power supply may be connected to the second probe PR2 and the third probe PR3 for supply a constant current, and the voltmeter may be connected to the second probe PR2 and the third probe PR3 also for measuring the voltage drop between the second probe PR2 and the third probe PR3 and obtaining a second resistance value $R_{10B}$ in a second two-point measurement step. In some embodiments, the first resistance value $R_{10A}$ may be substantially equal to the sum of the resistance $R_{L11}$ and the resistance $R_{L21}$, and the second resistance value $R_{10B}$ may be substantially equal to the sum of the resistance $R_{L22}$ and the resistance $R_{L31}$ especially when the resistances of the first common line CL1 and the second common line CL2 are relatively much lower than the resistance $R_{L11}$, the resistance $R_{L21}$, the resistance $R_{L22}$, and the resistance $R_{L31}$ and can be omitted accordingly. In some embodiments, the resistance $R_{L11}$ may be substantially equal to a half of the first resistance value $R_{10A}$, the resistance $R_{L21}$ may be substantially equal to a half of the first resistance value $R_{10A}$, the resistance $R_{L22}$ may be substantially equal to a half of the second resistance value $R_{10B}$, the resistance $R_{L31}$ may be substantially equal to a half of the second resistance value $R_{10B}$ when the first probe PR1, the second probe PR2, and the third probe PR3 are aligned in the first direction D1. The length of the second zigzag structure ZS2 located between the first end E21 and the contact end C21 and the length of the second zigzag structure ZS2 located between the second end E22 and the contact end C22 may be calculated according to the resistance measurement described above for monitoring the position of the second probe PR2 more precisely.

It is worth noting that the measuring approach of the resistance measurement in the method of monitoring the position of the probe with the probe position monitoring structure 102 is not limited to the measurement steps described above and other suitable measuring approaches may also be applied to measuring the resistance $R_{L11}$, the resistance $R_{L12}$, the resistance $R_{L21}$, the resistance $R_{L22}$, the resistance $R_{L31}$, and the resistance $R_{L32}$. Additionally, in some embodiments, the first common line CL1, the second common line CL2, the third common line CL3, the fourth common line CL4, and the contact portion CT may be at least located in a top layer of the stacked metal layer (such as the stacked metal layer SM represented in FIG. 3 described above), but not limited thereto.

It is worth noting that, in this embodiment, when the first common line CL1, the second common line CL2, the third common line CL3, and the fourth common line CL4 are respectively formed with metal layers in a stacked metal layer (such as the stacked metal layer SM represented in FIG. 3), the metal layers of each of the common lines should be separated physically and electrically from one another for avoiding forming closed circuits between the metal lines and influencing the resistance measurement described above. In other words, when each of the common lines are formed with the metal layers in the stacked metal layer, there is not any connecting plug (such as the connecting plugs V1-V3 represented in FIG. 3) disposed between the metal layers.

Figure 11:
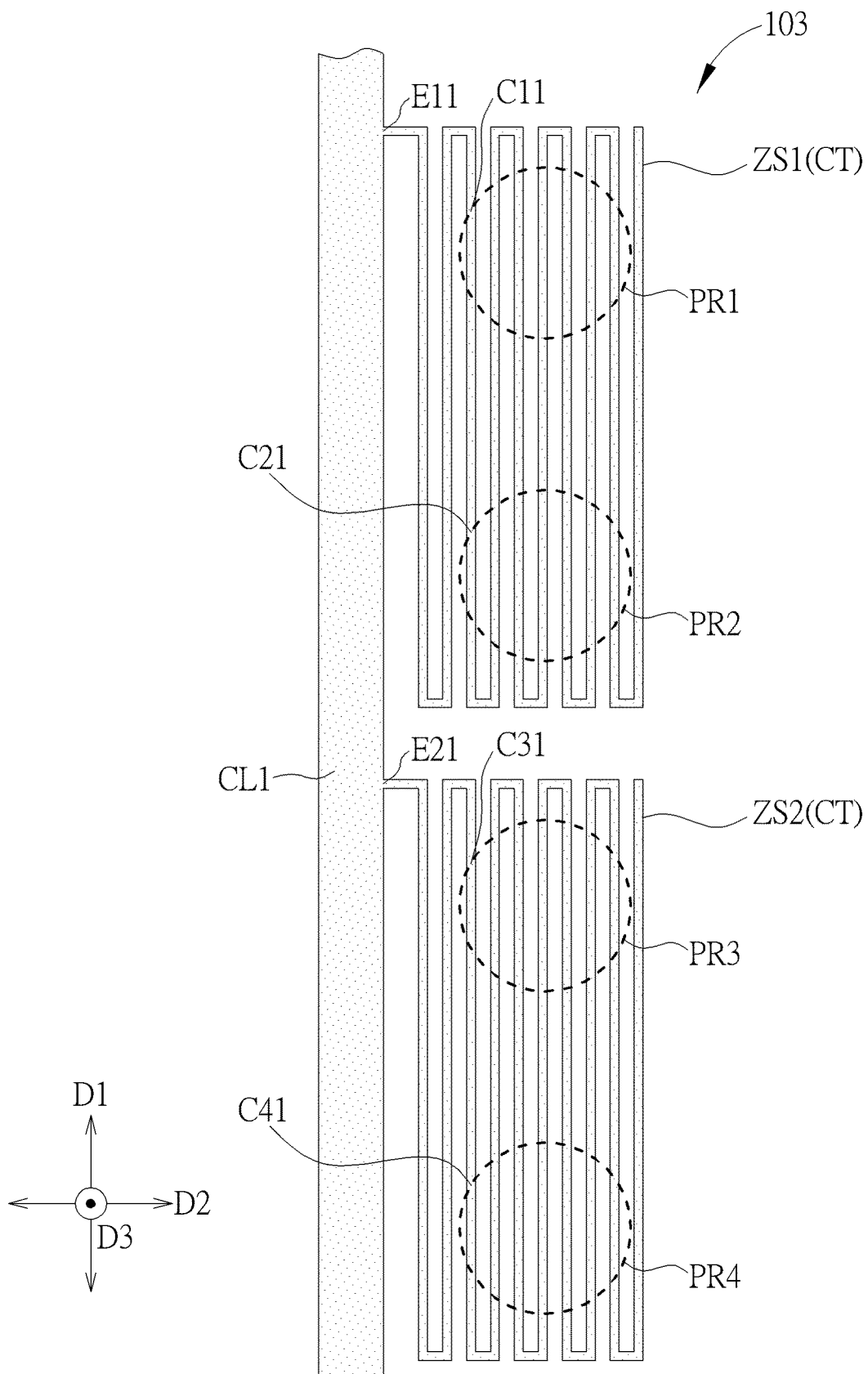
FIG. 11 is a schematic drawing illustrating a probe position monitoring structure according to a third embodiment of the present invention.
Figure 12:
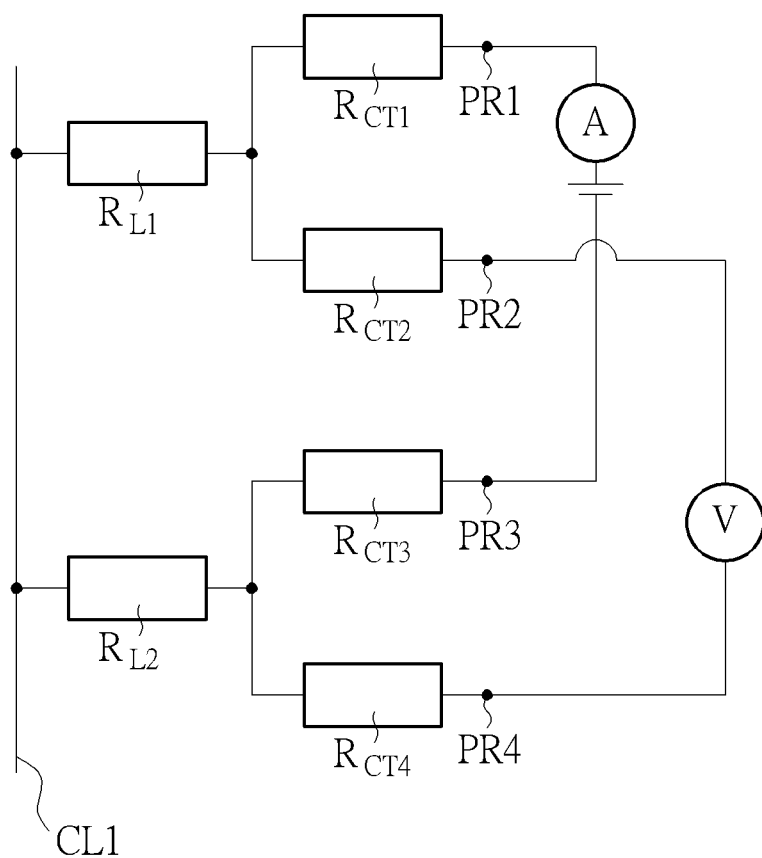
FIG. 12 is a schematic drawing illustrating a method of monitoring a position of a probe with the probe position monitoring structure of the third embodiment.

FIG. 11 is a schematic drawing illustrating a probe position monitoring structure 103 according to a third embodiment of the present invention. FIG. 12 is a schematic drawing illustrating a method of monitoring a position of a probe with the probe position monitoring structure 103. As illustrated in FIG. 11, the probe position monitoring structure 103 may include the first common line CL1 and the contact portion CT including the first zigzag structure ZS1 and the second zigzag structure ZS2 directly connected with the first common line CL1 respectively. Specifically, the first end E11 of the first zigzag structure ZS1 and the first end E21 of the second zigzag structure ZS2 may be directly connected with the first common line CL1 respectively. As illustrated in FIG. 11 and FIG. 12, the method of monitoring the position of the probe with the probe position monitoring structure 103 may include directly contacting the first zigzag structure ZS1 with the first probe PR1 and the second probe PR2 and directly contacting the second zigzag structure ZS2 with the third probe PR3 and a fourth probe PR4. A resistance $R_{CT1}$, a resistance $R_{CT2}$, a resistance $R_{CT3}$, and a resistance $R_{CT4}$ represented in FIG. 12 may be the contact resistance between the first probe PR1 and the first zigzag structure ZS1, the contact resistance between the second probe PR2 and the first zigzag structure ZS1, the contact resistance between the third probe PR3 and the second zigzag structure ZS2, and the contact resistance between the fourth probe PR4 and the second zigzag structure ZS2 respectively. Additionally, a resistance $R_{L1}$ represented in FIG. 12 may be the electrical resistance of the first zigzag structure ZS1 located between the first end E11 and the contact end C11 directly contacting the first probe PR1 because the length of the first zigzag structure ZS1 located between the first end E11 and the contact end C11 is less than the length of the first zigzag structure ZS1 located between the first end E11 and the contact end C21 directly contacting the second probe PR2, and a resistance $R_{L2}$ represented in FIG. 12 may be the electrical resistance of the second zigzag structure ZS2 located between the first end E21 and a contact end C31 directly contacting the third probe PR3 because the length of the second zigzag structure ZS2 located between the first end E21 and the contact end C31 is less than the length of the second zigzag structure ZS2 located between the first end E21 and a contact end C41 directly contacting the fourth probe PR4.

In some embodiments, the resistance measurement in the method of monitoring the position of the probe with the probe position monitoring structure 103 may include a four-point measurement step via the first probe PR1, the second probe PR2, the third probe PR3, and the fourth probe PR4. For example, as illustrated in FIG. 12, the DC power supply may be connected to the first probe PR1 and the third probe PR3 for supply a constant current, and the voltmeter may be connected to the second probe PR2 and the fourth probe PR4 for measuring the voltage drop between the second probe PR2 and the fourth probe PR4 and obtaining a resistance value substantially equal to the sum of the resistance $R_{L1}$ and the resistance $R_{L2}$ described above in a four-point measurement step. In some embodiments, the resistance $R_{L1}$ may be substantially equal to a half of the resistance value obtained in the four-point measurement step represented in FIG. 12, and the resistance $R_{L2}$ may be substantially equal to a half of the resistance value obtained in the four-point measurement step represented in FIG. 12 when the first probe PR1, the second probe PR2, the third probe PR3, and the fourth probe PR4 are aligned in the first direction D1, but not limited thereto. In other words, the contact resistance between the probe and the contact portion CT may be omitted by the four-point measurement step used in the resistance measurement described above, the length of the first zigzag structure ZS1 located between the first end E11 and the first probe PR1 and the length of the second zigzag structure ZS2 located between the first end E21 and the third probe PR3 may be calculated more accurately, and the position of the first probe PR1 and the position of the third probe PR3 may be monitored more precisely.

It is worth noting that the measuring approach of the resistance measurement in the method of monitoring the position of the probe with the probe position monitoring structure 103 is not limited to the measurement step described above and other suitable measuring approaches may also be applied to measuring the resistance $R_{L1}$ and the resistance $R_{L2}$. In addition, the measuring approach configured to omit the contact resistance between the probe and the contact portion CT in this embodiment may also be applied to other embodiments of the present invention.

Figure 13:
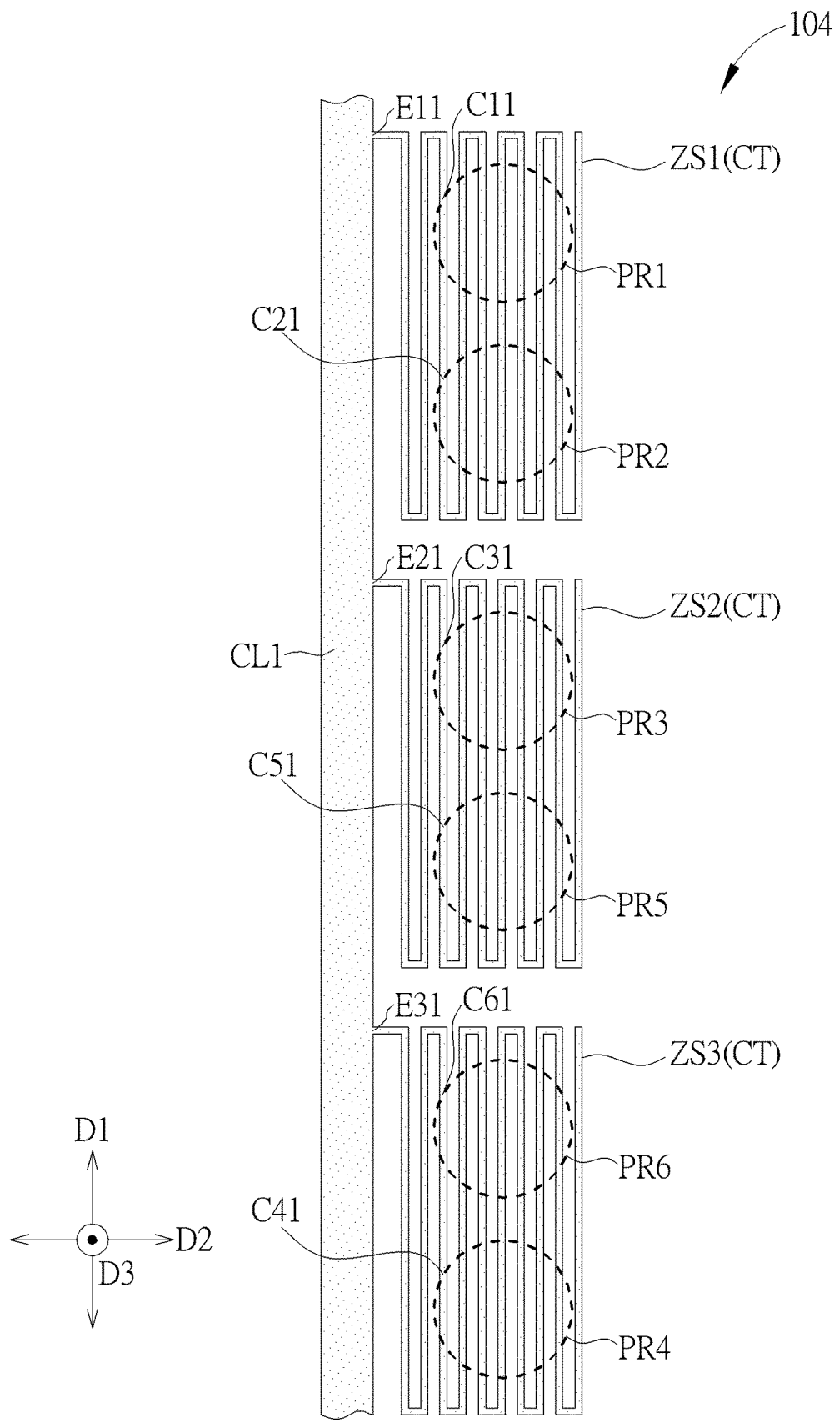
FIG. 13 is a schematic drawing illustrating a probe position monitoring structure according to a fourth embodiment of the present invention.
Figure 14C:
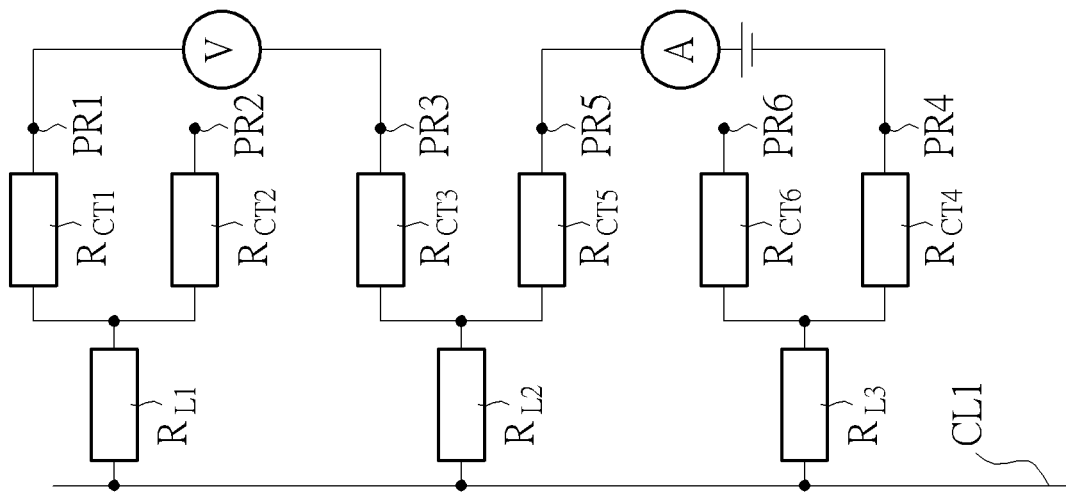
Figure 14B:
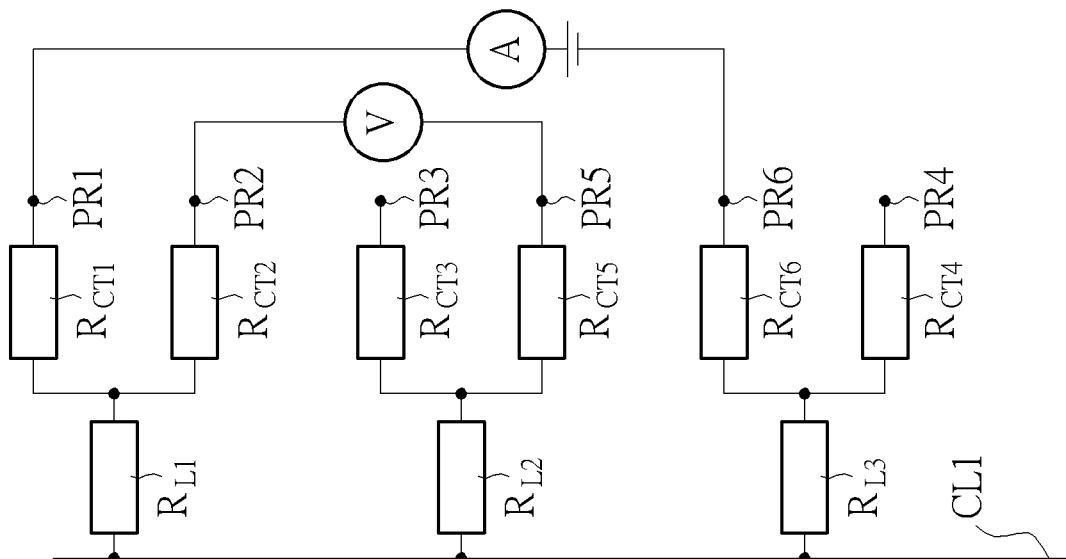
Figure 14A:
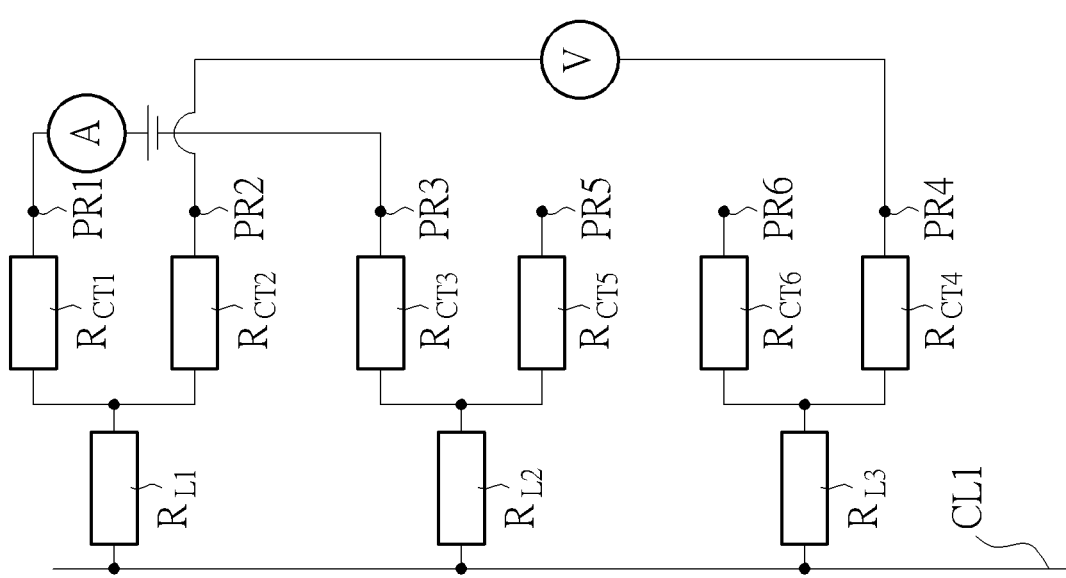

FIG. 13 is a schematic drawing illustrating a probe position monitoring structure 104 according to a fourth embodiment of the present invention. FIGS. 14A-14C are schematic drawings illustrating a method of monitoring a position of a probe with the probe position monitoring structure 104. As illustrated in FIG. 13, the probe position monitoring structure 104 may include the first common line CL1 and the contact portion CT including the first zigzag structure ZS1, the second zigzag structure ZS2, and the third zigzag structure ZS3 directly connected with the first common line CL1 respectively. Specifically, the first end E11 of the first zigzag structure ZS1, the first end E21 of the second zigzag structure ZS2, and the first end E31 of the third zigzag structure ZS3 may be directly connected with the first common line CL1 respectively. As illustrated in FIG. 13 and FIGS. 14A-14C, the method of monitoring the position of the probe with the probe position monitoring structure 104 may include directly contacting the first zigzag structure ZS1 with the first probe PR1 and the second probe PR2, directly contacting the second zigzag structure ZS2 with the third probe PR3 and a fifth probe PR5, and directly contacting the third zigzag structure ZS3 with the fourth probe PR4 and a sixth probe PR6. The resistance $R_{CT1}$, the resistance $R_{CT2}$, the resistance $R_{CT3}$, the resistance $R_{CT4}$, a resistance $R_{CT5}$, and a resistance $R_{CT6}$ represented in FIGS. 14A-14C may be the contact resistance between the first probe PR1 and the first zigzag structure ZS1, the contact resistance between the second probe PR2 and the first zigzag structure ZS1, the contact resistance between the third probe PR3 and the second zigzag structure ZS2, the contact resistance between the fourth probe PR4 and the third zigzag structure ZS3, the contact resistance between the fifth probe PR5 and the second zigzag structure ZS2, and the contact resistance between the sixth probe PR6 and the third zigzag structure ZS3 respectively. Additionally, the resistance $R_{L1}$ represented in FIGS. 14A-14C may be the electrical resistance of the first zigzag structure ZS1 located between the first end E11 and the contact end C11 directly contacting the first probe PR1 because the length of the first zigzag structure ZS1 located between the first end E11 and the contact end C11 is less than the length of the first zigzag structure ZS1 located between the first end E11 and the contact end C21 directly contacting the second probe PR2, the resistance $R_{L2}$ represented in FIGS. 14A-14C may be the electrical resistance of the second zigzag structure ZS2 located between the first end E21 and the contact end C31 directly contacting the third probe PR3 because the length of the second zigzag structure ZS2 located between the first end E21 and the contact end C31 is less than the length of the second zigzag structure ZS2 located between the first end E21 and a contact end C51 directly contacting the fifth probe PR5, and a resistance $R_{L3}$ represented in FIGS. 14A-14C may be the electrical resistance of the third zigzag structure ZS3 located between the first end E31 and a contact end C61 directly contacting the sixth probe PR6 because the length of the third zigzag structure ZS3 located between the first end E31 and the contact end C61 is less than the length of the third zigzag structure ZS3 located between the first end E31 and the contact end C41 directly contacting the fourth probe PR4.

In some embodiments, the resistance measurement in the method of monitoring the position of the probe with the probe position monitoring structure 104 may include four-point measurement steps via the first probe PR1, the second probe PR2, the third probe PR3, the fourth probe PR4, the fifth probe PR5, and/or the sixth probe PR6. For example, as illustrated in FIG. 14A, the DC power supply may be connected to the first probe PR1 and the third probe PR3 for supply a constant current, and the voltmeter may be connected to the second probe PR2 and the fourth probe PR4 for measuring the voltage drop between the second probe PR2 and the fourth probe PR4 and obtaining a resistance value substantially equal to the resistance $R_{L1}$ described above in a four-point measurement step via the first probe PR1, the second probe PR2, the third probe PR3, and the fourth probe PR4. As illustrated in FIG. 14B, the DC power supply may be connected to the first probe PR1 and the sixth probe PR6 for supply a constant current, and the voltmeter may be connected to the second probe PR2 and the fifth probe PR5 for measuring the voltage drop between the second probe PR2 and the fifth probe PR5 and obtaining a resistance value substantially equal to the resistance $R_{L1}$ described above in another four-point measurement step via the first probe PR1, the second probe PR2, the fifth probe PR5, and the sixth probe PR6. As illustrated in FIG. 14C, the DC power supply may be connected to the fifth probe PR5 and the fourth probe PR4 for supply a constant current, and the voltmeter may be connected to the first probe PR1 and the third probe PR3 for measuring the voltage drop between the first probe PR1 and the third probe PR3 and obtaining a resistance value substantially equal to the resistance $R_{L2}$ described above in a four-point measurement step via the first probe PR1, the third probe PR3, the fourth probe PR4, and the fifth probe PR5. In addition, the resistance $R_{L3}$ described above may be obtained by a four-point measurement step similar to a modification of the four-point measurement step represented in FIG. 14A and/or a modification of the four-point measurement step represented in FIG. 14B. For example, the DC power supply may be connected to the fifth probe PR5 and the fourth probe PR4 for supply a constant current, and a voltmeter may be connected to the first probe PR1 and the sixth probe PR6 for measuring the voltage drop between the first probe PR1 and the sixth probe PR6 and obtaining a resistance value substantially equal to the resistance $R_{L3}$ described above in a four-point measurement step via the first probe PR1, the fourth probe PR4, the fifth probe PR5, and the sixth probe PR6. The contact resistance between the probe and the contact portion CT may be omitted by the four-point measurement step used in the resistance measurement described above, the length of the first zigzag structure ZS1 located between the first end E11 and the first probe PR1, the length of the second zigzag structure ZS2 located between the first end E21 and the third probe PR3, and the length of the third zigzag structure ZS3 located between the first end E31 and the sixth probe PR6 may be calculated more accurately, and the positions of the first probe PR1, the third probe PR3, and the sixth probe PR6 may be monitored more precisely.

It is worth noting that the measuring approach of the resistance measurement in the method of monitoring the position of the probe with the probe position monitoring structure 104 is not limited to the measurement steps described above and other suitable measuring approaches may also be applied to measuring the resistance $R_{L1}$, the resistance $R_{L2}$, and the resistance $R_{L3}$. In addition, the measuring approach configured to omit the contact resistance between the probe and the contact portion CT in this embodiment may also be applied to other embodiments of the present invention.

Figure 15:
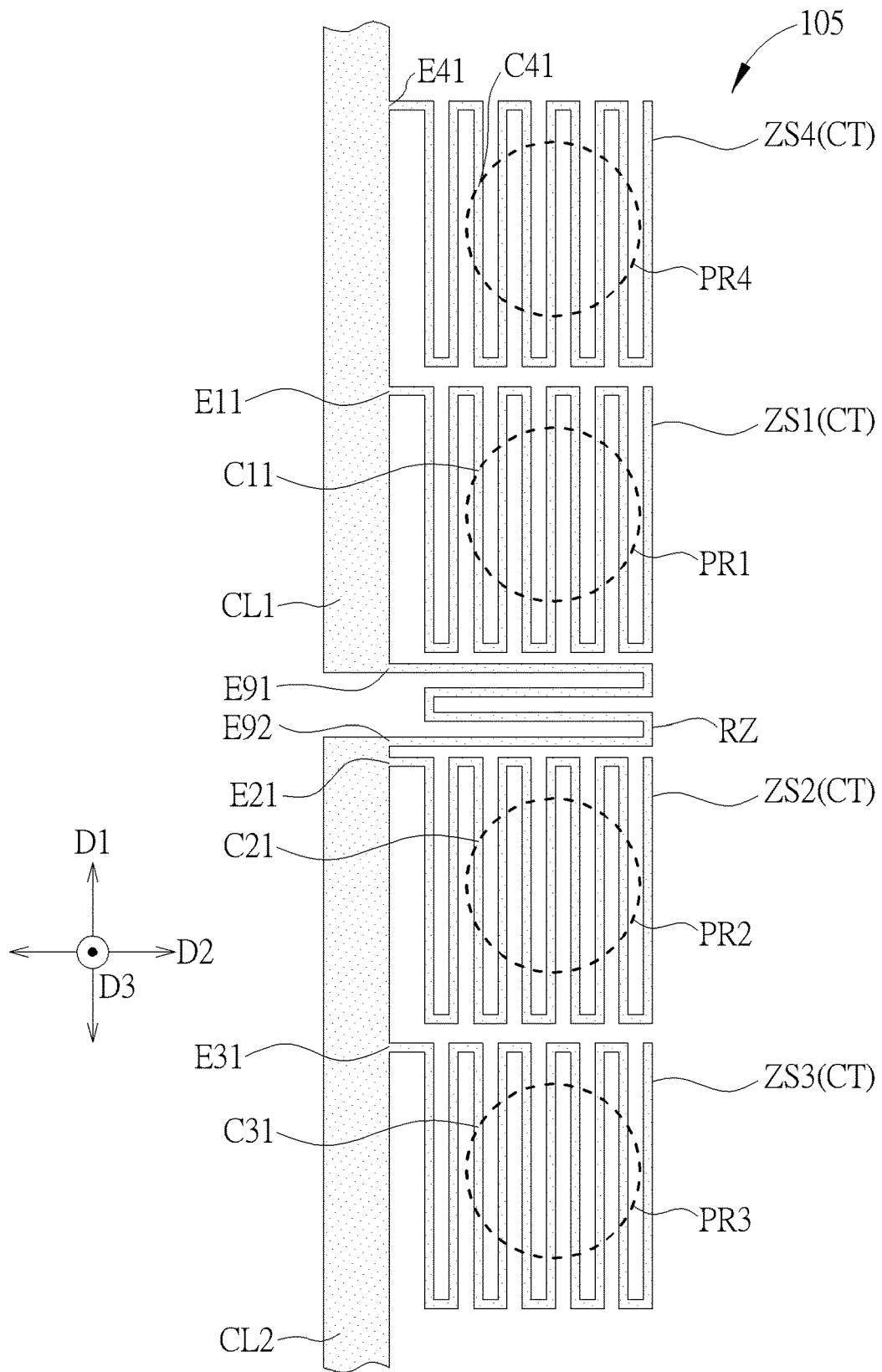
FIG. 15 is a schematic drawing illustrating a probe position monitoring structure according to a fifth embodiment of the present invention.
Figure 16:
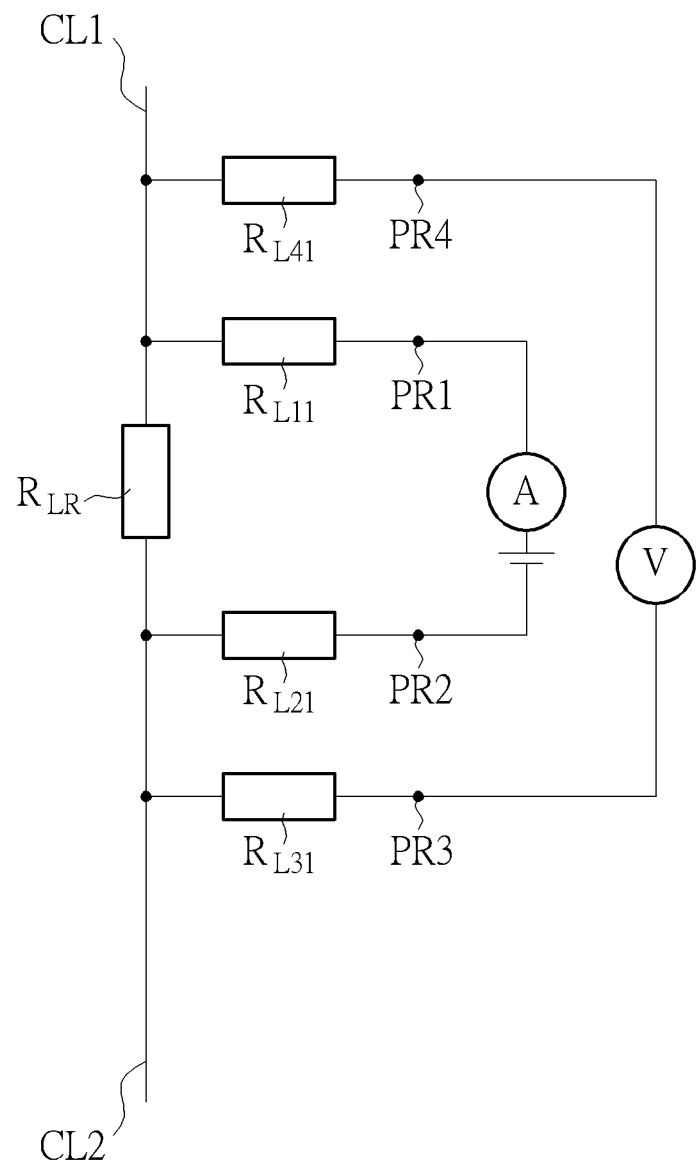
FIG. 16 is a schematic drawing illustrating a method of monitoring a position of a probe with the probe position monitoring structure of the fifth embodiment.

FIG. 15 is a schematic drawing illustrating a probe position monitoring structure 105 according to a fifth embodiment of the present invention. FIG. 16 is a schematic drawing illustrating a method of monitoring a position of a probe with the probe position monitoring structure 105. As illustrated in FIG. 15, the probe position monitoring structure 105 includes the first common line CL1, the second common line CL2, a reference zigzag structure RZ, and the contact portion CT including the first zigzag structure ZS1 and the second zigzag structure ZS2. The first end E11 of the first zigzag structure ZS1 may be directly connected with the first common line CL1, and the first end E21 of the second zigzag structure ZS2 may be directly connected with the second common line CL2. The reference zigzag structure RZ may be disposed between the first zigzag structure ZS1 and the second zigzag structure ZS2 in the first direction D1. A first end E91 of the reference zigzag structure RZ may be directly connected with the first common line CL1, a second end E92 of the reference zigzag structure RZ may be directly connected with the second common line CL2, and a line width of the reference zigzag structure RZ may be equal to the line width of the first zigzag structure ZS1 and/or the line width of the second zigzag structure ZS2. In some embodiments, the contact portion CT may further include the third zigzag structure ZS3 and a fourth zigzag structure ZS4. A first end E41 of the fourth zigzag structure ZS4 may be directly connected with the first common line CL1, and the first end E31 of the third zigzag structure ZS3 may be directly connected with the second common line CL2. The first zigzag structure ZS1, the second zigzag structure ZS2, the third zigzag structure ZS3, and the fourth zigzag structure ZS4 may be aligned in the first direction D1, and the first zigzag structure ZS1 and the second zigzag structure ZS2 may be disposed between the fourth zigzag structure ZS4 and the third zigzag structure ZS3 in the first direction D1. In some embodiments, the pattern of the first zigzag structure ZS1, the pattern of the second zigzag structure ZS2, the pattern of the third zigzag structure ZS3, and a pattern of the fourth zigzag structure ZS4 in the third direction D3 may be identical to one another, but not limited thereto. In some embodiments, the reference zigzag structure RZ is not a part of the contact portion CT, but the reference zigzag structure RZ, the first zigzag structure ZS1, the second zigzag structure ZS2, the third zigzag structure ZS3, the fourth zigzag structure ZS4, the first common line CL1, and the second common line CL2 may be different parts of one conductive layer (such as the metal layer M4 represented in FIG. 3), but not limited thereto.

As illustrated in FIG. 15 and FIG. 16, the method of monitoring the position of the probe with the probe position monitoring structure 105 may include directly contacting the first zigzag structure ZS1 with the first probe PR1, directly contacting the second zigzag structure ZS2 with the second probe PR2, directly contacting the third zigzag structure ZS3 with the third probe PR3, and directly contacting the fourth zigzag structure ZS4 with the fourth probe PR4. The resistance $R_{L11}$ represented in FIG. 16 may be the electrical resistance of the first zigzag structure ZS1 located between the first end E11 and the contact end C11 directly contacting the first probe PR1, the resistance $R_{L21}$ represented in FIG.

16 may be the electrical resistance of the second zigzag structure ZS2 located between the first end E21 and the contact end C21 directly contacting the second probe PR2, the resistance $R_{L31}$ represented in FIG. 16 may be the electrical resistance of the third zigzag structure ZS3 located between the first end E31 and the contact end C31 directly contacting the third probe PR3, a resistance $R_{L41}$ represented in FIG. 16 may be the electrical resistance of the fourth zigzag structure ZS4 located between the first end E41 and a contact end C41 directly contacting the fourth probe PR4, and the resistance $R_{LR}$ represented in FIG. 16 may be the electrical resistance of the reference zigzag structure RZ.

In some embodiments, the resistance measurement in the method of monitoring the position of the probe with the probe position monitoring structure 105 may include a four-point measurement step via the first probe PR1, the second probe PR2, the third probe PR3, and the fourth probe PR4. For example, as illustrated in FIG. 16, the DC power supply may be connected to the first probe PR1 and the second probe PR2 for supply a constant current, and the voltmeter may be connected to the fourth probe PR4 and the third probe PR3 for measuring the voltage drop between the fourth probe PR4 and the third probe PR3 and obtaining a resistance value substantially equal to the resistance $R_{LR}$ described above in a four-point measurement step via the first probe PR1, the second probe PR2, the third probe PR3, and the fourth probe PR4. The actual line width of the zigzag structures may be calculated according to the resistance $R_{LR}$ obtained by the resistance measurement described above because the line width design value of the reference zigzag structure RZ is identical to that of other zigzag structures, and because the reference zigzag structure RZ and the zigzag structures may be formed with the same material formed concurrently by the same process. In other words, the resistance $R_{LR}$ may be used to calculate the length of the first zigzag structure ZS1 located between the first end E11 and the first probe PR1, the length of the second zigzag structure ZS2 located between the first end E21 and the second probe PR2, the length of the third zigzag structure ZS3 located between the first end E31 and the third probe PR3, and the length of the fourth zigzag structure ZS4 located between the first end E41 and the fourth probe PR4 more accurately, and the positions of the first probe PR1, the second probe PR2, the third probe PR3, and the fourth probe PR4 may be monitored more precisely. In addition, the resistance $R_{L11}$, the resistance $R_{L21}$, the resistance $R_{L31}$, and the resistance $R_{L41}$ in this embodiment may be measured by the measurement steps in the embodiments described above or other suitable measurement approaches, and the reference zigzag structure RZ may be applied in other embodiments of the present invention according to some design considerations.

It is worth noting that, in this embodiment, when the first common line CL1 and the second common line CL2 are formed with metal layers in a stacked metal layer (such as the stacked metal layer SM represented in FIG. 3), the metal layers in the first common line CL1 and the second common line CL2 should be separated physically and electrically from one another for avoiding forming closed circuits between the metal lines and influencing the resistance measurement described above. In other words, when the first common line CL1 and the second common line CL2 are formed with the metal layers in the stacked metal layer, there is not any connecting plug (such as the connecting plugs V1-V3 represented in FIG. 3) disposed between the metal layers.

To summarize the above descriptions, according to the probe position monitoring structure and the method of monitoring the position of the probe in the present invention, the contact portion of the probe position monitoring structure includes the zigzag structure for being used in the resistance measurement where the probe directly contacts the zigzag structure, and the position of the probe may be monitored by measuring the resistance of the zigzag structure between the common line and the probe and calculating the length of the zigzag structure between the common line and the probe.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A probe position monitoring structure, comprising:
    a first common line; and
    a contact portion configured for being directly contacted with probes, wherein the contact portion comprises:
        a first zigzag structure extending in a horizontal direction for being directly contacted with a first probe in a vertical direction, wherein a first end of the first zigzag structure is directly connected with the first common line;
        a second zigzag structure extending in the horizontal direction for being directly contacted with a second probe in the vertical direction, wherein a first end of the second zigzag structure is directly connected with the first common line; and
        a third zigzag structure extending in the horizontal direction for being directly contacted with a third probe in the vertical direction, wherein a first end of the third zigzag structure is directly connected with the first common line.

2. The probe position monitoring structure according to claim 1,
    wherein the first zigzag structure comprises:
    first sections, wherein each of the first sections is elongated in a first direction; and
    second sections, wherein each of the second sections is elongated in a second direction different from the first direction and directly connected with two of the first sections located adjacent to each other.

3. The probe position monitoring structure according to claim 2, wherein a width of each of the first sections is less than a width of the first common line.

4. The probe position monitoring structure according to claim 3, wherein a ratio of the width of the first common line to the width of each of the first sections ranges from 5 to 200.

5. The probe position monitoring structure according to claim 1, wherein a pattern of the second zigzag structure is identical to a pattern of the first zigzag structure.

6. The probe position monitoring structure according to claim 5, wherein a pattern of the third zigzag structure is identical to the pattern of the first zigzag structure.

7. The probe position monitoring structure according to claim 1, further comprising:
    an interlayer dielectric, wherein the first common line and the contact portion are at least partially disposed in the interlayer dielectric, and the first zigzag structure comprises a first layer and a second layer separated from each other by a portion of the interlayer dielectric.

8. The probe position monitoring structure according to claim 1, wherein the first zigzag structure, the second zigzag structure, the third zigzag structure, and the first common line are different parts of a metal layer.

9. A method of monitoring a position of a probe, comprising:
providing a probe position monitoring structure, wherein the probe position monitoring structure comprises:
a first common line; and
a contact portion, wherein the contact portion comprises:
a first zigzag structure extending in a horizontal direction, wherein a first end of the first zigzag structure is directly connected with the first common line;
a second zigzag structure extending in the horizontal direction, wherein a first end of the second zigzag structure is directly connected with the first common line; and
a third zigzag structure extending in the horizontal direction, wherein a first end of the third zigzag structure is directly connected with the first common line;
directly contacting the first zigzag structure extending in the horizontal direction with a first probe in a vertical direction;
directly contacting the second zigzag structure extending in the horizontal direction with a second probe in the vertical direction;
directly contacting the third zigzag structure extending in the horizontal direction with a third probe in the vertical direction; and
performing a resistance measurement to measure a resistance of a portion of the first zigzag structure located between the first probe and the first end of the first zigzag structure, a resistance of a portion of the second zigzag structure located between the second probe and the first end of the second zigzag structure, and a resistance of a portion of the third zigzag structure located between the third probe and the first end of the third zigzag structure.

10. The method of monitoring the position of the probe according to claim 9, further comprising:
calculating a length of the portion of the first zigzag structure located between the first probe and the first end of the first zigzag structure according to a result of the resistance measurement.

11. The method of monitoring the position of the probe according to claim 9, wherein the resistance measurement comprises two-point measurement steps or three-point measurement steps via the first probe, the second probe, and the third probe.

12. The method of monitoring the position of the probe according to claim 9, further comprising:
calculating a length of the portion of the second zigzag structure located between the second probe and the first end of the second zigzag structure and a length of the portion of the third zigzag structure located between the third probe and the first end of the third zigzag structure according to a result of the resistance measurement.

* * * * *